(12) United States Patent
Jin et al.

(10) Patent No.: US 12,142,541 B2
(45) Date of Patent: Nov. 12, 2024

(54) SEMICONDUCTOR PACKAGE

(71) Applicant: Samsung Electronics Co., Ltd., Suwon-si (KR)

(72) Inventors: Jeonggi Jin, Seoul (KR); Jumyong Park, Yongin-si (KR); Jinho An, Seoul (KR); Taehwa Jeong, Hwaseong-si (KR); Jinho Chun, Seoul (KR); Juil Choi, Seongnam-si (KR); Atsushi Fujisaki, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 161 days.

(21) Appl. No.: 16/829,227

(22) Filed: Mar. 25, 2020

(65) Prior Publication Data
US 2021/0035878 A1   Feb. 4, 2021

(30) Foreign Application Priority Data

Jul. 31, 2019   (KR) .................. 10-2019-0093355

(51) Int. Cl.
*H01L 23/31* (2006.01)
*H01L 23/29* (2006.01)
*H01L 23/522* (2006.01)

(52) U.S. Cl.
CPC ........ *H01L 23/3114* (2013.01); *H01L 23/293* (2013.01); *H01L 23/3121* (2013.01); *H01L 23/5226* (2013.01)

(58) Field of Classification Search
CPC ............. H01L 23/3128; H01L 25/0657; H01L 25/074; H01L 2225/06568; H01L 2225/06555; H01L 21/8221; H01L 23/49827; H01L 23/5384; H01L 23/481; H01L 29/4175; H01L 2225/06541–06544; H01L 2225/06548; H01L 21/76898; H01L 23/3185; H01L 23/3157; H01L 23/3114; H01L 23/3121; H01L 23/31; H01L 21/563; H01L 23/49811; H01L 25/0652; H01L 25/043; H01L 25/071; H01L 25/0756; H01L 25/112; H01L 25/117; H01L 2224/08145; H01L 27/0688;
(Continued)

(56) References Cited

U.S. PATENT DOCUMENTS 8,952,544 B2   2/2015 Lin et al.
9,159,678 B2 * 10/2015 Cheng ................. H01L 23/3157
(Continued)

FOREIGN PATENT DOCUMENTS

TW   201838108 A   10/2018

*Primary Examiner* — Younes Boulghassoul
*Assistant Examiner* — Quinton A Brasfield
(74) *Attorney, Agent, or Firm* — Myers Bigel, P.A.

(57) ABSTRACT

A semiconductor package includes a semiconductor chip including a chip pad; a lower redistribution structure on the semiconductor chip, the lower redistribution structure including a lower redistribution insulating layer and a lower redistribution pattern electrically connected to the chip pad of the semiconductor chip; a molding layer on at least a portion of the semiconductor chip; and a conductive post in the molding layer, the conductive post having a bottom surface and a top surface, the bottom surface of the conductive post being in contact with the lower redistribution pattern of the lower redistribution structure and the top surface of the conductive post having a concave shape.

20 Claims, 25 Drawing Sheets

(58) Field of Classification Search
CPC ......... H01L 2224/023–024; H01L 2224/0235;
H01L 2224/02372; H01L 2224/02373;
H01L 23/49822; H01L 23/5383; H01L
21/823475; H01L 21/823871; H01L
21/76895; H01L 21/76897; H01L 21/743;
H01L 21/76804; H01L 21/76805; H01L
21/28506; H01L 21/28525; H01L
21/76843; H01L 21/76831; H01L
23/5226; H01L 23/5283; H01L 23/5286;
H01L 23/528; H01L 23/535; H01L
23/5386; H01L 23/3107–3192; H01L
21/561; H01L 21/565
See application file for complete search history.

(56) References Cited

U.S. PATENT DOCUMENTS

| | | | |
|---|---|---|---|
| 9,378,982 B2* | 6/2016 | Lin | H01L 25/50 |
| 9,437,583 B1* | 9/2016 | Shih | H01L 23/3157 |
| 9,633,939 B2* | 4/2017 | Kim | H01L 23/3128 |
| 10,872,850 B2 | 12/2020 | Cheng et al. | |
| 10,971,477 B2* | 4/2021 | Yu | H01L 23/3128 |
| 2013/0037929 A1 | 2/2013 | Essig et al. | |
| 2014/0306339 A1* | 10/2014 | Ohira | H01L 21/3212 257/737 |
| 2015/0035159 A1* | 2/2015 | Lin | H01L 21/76841 257/762 |
| 2015/0098204 A1* | 4/2015 | Yoshikawa | H01L 23/00 361/767 |
| 2015/0262909 A1* | 9/2015 | Chen | H01L 24/82 438/126 |
| 2017/0053898 A1* | 2/2017 | Yeh | H01L 25/50 |
| 2017/0271248 A1* | 9/2017 | Chen | H01L 23/5389 |
| 2017/0301648 A1 | 10/2017 | Mao et al. | |
| 2017/0338177 A1 | 11/2017 | Lin et al. | |
| 2018/0082988 A1* | 3/2018 | Cheng | H01L 21/6835 |
| 2018/0254238 A1* | 9/2018 | Tsai | H01L 24/81 |
| 2018/0330966 A1 | 11/2018 | Scanlan et al. | |
| 2019/0006314 A1* | 1/2019 | Jeng | H01L 21/4853 |
| 2019/0057933 A1 | 2/2019 | Lin | |
| 2019/0067249 A1* | 2/2019 | Huang | H01L 25/50 |
| 2019/0103362 A1* | 4/2019 | Lin | H01L 23/3114 |
| 2019/0103364 A1 | 4/2019 | Kim | |
| 2019/0109098 A1 | 4/2019 | Lin et al. | |
| 2020/0185352 A1* | 6/2020 | Lee | H01L 25/50 |

* cited by examiner

SEMICONDUCTOR PACKAGE

CROSS-REFERENCE TO RELATED APPLICATION

This application claims the benefit of Korean Patent Application No. 10-2019-0093355, filed on Jul. 31, 2019, in the Korean Intellectual Property Office, the disclosure of which is incorporated herein in its entirety by reference.

BACKGROUND

The present disclosure relates to semiconductor packages and, more particularly, to fan-out semiconductor packages. With the rapid increase in demand for portable devices in the recent electronic products market, electronic components mounted on electronic products have continuously been required to be compact and light. To make electronic components compact and light, a semiconductor package mounted on the electronic components may be designed to be small in volume and to process a large amount of data. In particular, in a highly-integrated semiconductor chip having an increased number of input/output (I/O) terminals, the distance between I/O terminals is decreased, and accordingly, interference may occur between the I/O terminals. To remove the interference between I/O terminals, a fan-out semiconductor package enabling the distance between I/O terminals to increase may be used.

SUMMARY

The inventive concepts provide semiconductor packages having increased reliability.

According to an aspect of the inventive concepts, there is provided a semiconductor package including a semiconductor chip including a chip pad; a lower redistribution structure on the semiconductor chip, the lower redistribution structure including a lower redistribution insulating layer and a lower redistribution pattern electrically connected to the chip pad of the semiconductor chip; a molding layer on at least a portion of the semiconductor chip; and a conductive post in the molding layer, the conductive post having a bottom surface and a top surface, the bottom surface of the conductive post being in contact with the lower redistribution pattern of the lower redistribution structure and the top surface of the conductive post having a concave shape.

According to another aspect of the inventive concepts, there is provided a semiconductor package including a lower redistribution structure including a lower redistribution insulating layer and a lower redistribution pattern; a lower semiconductor chip on a first surface of the lower redistribution insulating layer, the lower semiconductor chip being electrically connected to the lower redistribution pattern; a conductive post on the first surface of the lower redistribution insulating layer, the conductive post being electrically connected to the lower redistribution pattern and having a top surface having a concave shape; a molding layer on a side surface of the lower semiconductor chip and a side surface of the conductive post, the molding layer having a top surface at a higher level than the top surface of the conductive post; and an upper redistribution structure on the molding layer and the lower semiconductor chip, the upper redistribution structure including an upper redistribution insulating layer and an upper redistribution pattern, the upper redistribution insulating layer being on the top surface of the conductive post and the upper redistribution pattern penetrating a portion of the upper redistribution insulating layer and contacting the conductive post.

According to a further aspect of the inventive concepts, there is provided a semiconductor package including a lower redistribution structure including a lower redistribution insulating layer and a lower redistribution pattern; a semiconductor chip on a first surface of the lower redistribution insulating layer, the semiconductor chip being electrically connected to the lower redistribution pattern; a molding layer on a side surface of the semiconductor chip; and a conductive post in the molding layer, the conductive post having a bottom surface and a top surface, the bottom surface of the conductive post being in contact with the lower redistribution pattern of the lower redistribution structure and the top surface of the conductive post being at a lower level than a top surface of the molding layer. The conductive post may be on an inner wall of the molding layer. A corner portion of the molding layer may be between the top surface of the molding layer and the inner wall of the molding layer and may be chamfered or rounded.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
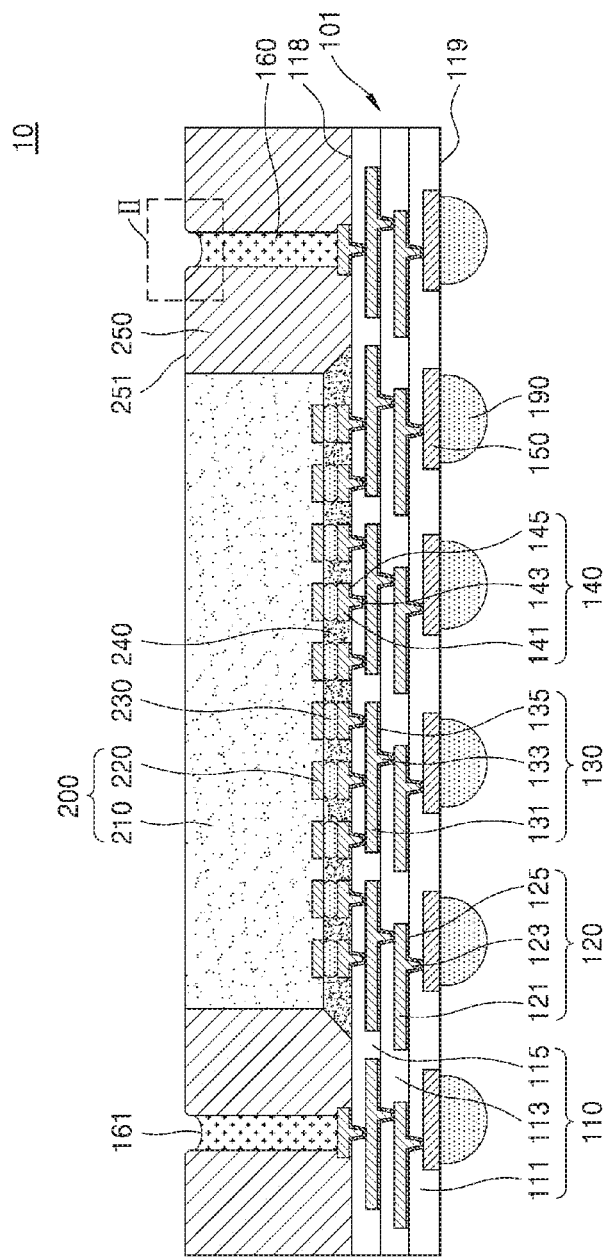
FIG. 1 is a cross-sectional view of a semiconductor package according to example embodiments.

Hereinafter, embodiments will be described with reference to the attached drawings. In the drawings, like numerals denote like elements and redundant descriptions thereof may be omitted.

Figure 2:
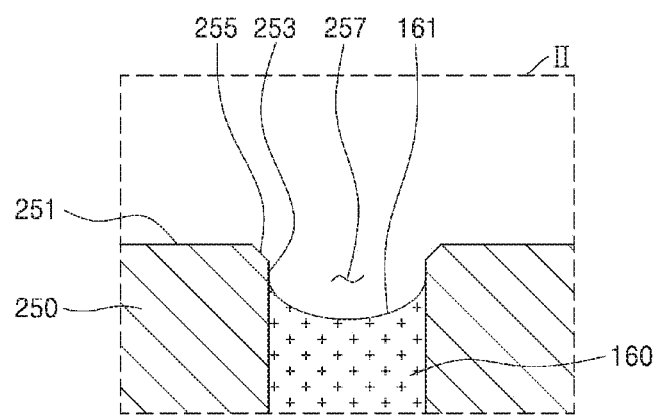
FIG. 2 is an enlarged cross-sectional view of a region II in FIG. 1.

FIG. 1 is a cross-sectional view of a semiconductor package 10 according to example embodiments. FIG. 2 is an enlarged cross-sectional view of a region II in FIG. 1.

Referring to FIGS. 1 and 2, the semiconductor package 10 may include a redistribution structure 101, a semiconductor chip 200, a conductive post 160, and a molding layer 250.

The redistribution structure 101 may include a redistribution insulating layer 110, a plurality of redistribution patterns, e.g., first through third redistribution patterns 120, 130, and 140, and an external electrode pad 150.

The redistribution insulating layer 110 may include a plurality of insulating layers, e.g., first through third insulating layers 111, 113, and 115. The first through third insulating layers 111, 113, and 115 may be formed from, for example, a material film including an organic compound. In example embodiments, the first through third insulating layers 111, 113, and 115 may be formed from a material layer including an organic polymer material. In example embodiments, the first through third insulating layers 111, 113, and 115 may include a photo-imagable dielectric (PID) material enabling a photo lithography process. For example, the first through third insulating layers 111, 113, and 115 may include photosensitive polyimide (PSPI). In example embodiments, the first through third insulating layers 111, 113, and 115 may include oxide or nitride. For example, the first through third insulating layers 111, 113, and 115 may include silicon oxide or silicon nitride.

The first through third redistribution patterns 120, 130, and 140 may include first through third conductive line patterns 121, 131, and 141, respectively, and first through third conductive via patterns 123, 133, and 143, respectively. Each of the first through third conductive line patterns 121, 131, and 141 may be on at least one selected from a top surface and a bottom surface of a corresponding one of the first through third insulating layers 111, 113, and 115. The first through third conductive via patterns 123, 133, and 143 may penetrate through at least one selected from the first through third insulating layers 111, 113, and 115. The first through third conductive via patterns 123, 133, and 143 may be connected to at least one selected from the first through third conductive line patterns 121, 131, and 141 or to the external electrode pad 150.

A plurality of seed layers, e.g., first through third seed layers 125, 135, and 145, may be respectively arranged between the first through third insulating layers 111, 113, and 115 and the first through third conductive line patterns 121, 131, and 141 and respectively arranged between the first through third insulating layers 111, 113, and 115 and the first through third conductive via patterns 123, 133, and 143. In example embodiments, the first through third seed layers 125, 135, and 145 may be formed using physical vapor deposition and the first through third conductive line patterns 121, 131, and 141 and the first through third conductive via patterns 123, 133, and 143 may be formed using electroless plating.

For example, the first through third seed layers 125, 135, and 145 may be selected from a group of copper (Cu), titanium (Ti), titanium tungsten (TiW), titanium nitride (TiN), tantalum (Ta), tantalum nitride (TaN), chromium (Cr), aluminum (Al), and so on. However, the first through third seed layers 125, 135, and 145 are not limited to the above materials. In example embodiments, the first through third seed layers 125, 135, and 145 may include Cu/Ti, in which Cu is stacked on Ti, or Cu/TiW, in which Cu is stacked on TiW.

The first through third conductive line patterns 121, 131, and 141 and the first through third conductive via patterns 123, 133, and 143 may include a metal, such as Cu, Al, W, Ti, Ta, indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof but are not limited thereto. In example embodiments, when Cu is used for the first through third conductive line patterns 121, 131, and 141 and the first through third conductive via patterns 123, 133, and 143, at least a portion of the first through third seed layers 125, 135, and 145 may act as a diffusion barrier.

The external electrode pad 150 may be arranged on a bottom surface of the redistribution structure 101. An external connector 190 may be arranged on the external electrode pad 150. The semiconductor package 10 may be electrically connected to and mounted on a module substrate or a system board of an electronic product through the external connector 190. The external electrode pad 150 may function as under bump metallurgy (UBM) on which the external connector 190 is arranged.

In example embodiments, the external electrode pad 150 may have a uniform thickness overall. A bottom surface of the external electrode pad 150, on which the external connector 190 is arranged, may be flat. For example, the external electrode pad 150 may include a metal, such as Cu, Al, W, Ti, Ta, In, Mo, Mn, Co, Sn, Ni, Mg, Re, Be, Ga, or Ru, or an alloy thereof but is not limited thereto.

The configuration of the redistribution structure 101 will be described in detail below.

The redistribution insulating layer 110 may include the first insulating layer 111, the second insulating layer 113, and the third insulating layer 115, which are sequentially stacked. The first redistribution pattern 120 may include the first conductive line pattern 121, the first conductive via pattern 123, and the first seed layer 125. The second redistribution pattern 130 may include the second conductive line pattern 131, the second conductive via pattern 133, and the second seed layer 135. The third redistribution pattern 140 may include the third conductive line pattern 141, the third conductive via pattern 143, and the third seed layer 145.

The first insulating layer 111 may include a first via opening (VO1 in FIG. 9E) over (e.g., exposing) a portion of the external electrode pad 150. The first seed layer 125 may be arranged on a portion of a top surface of the first insulating layer 111, an inner wall of the first via opening VO1, and a portion of a top surface of the external electrode pad 150, which is exposed through the first via opening VO1. A portion of the first seed layer 125 may be between the first conductive line pattern 121 and the top surface of the first insulating layer 111. Another portion of the first seed layer 125 may be arranged between the first conductive via pattern 123 and the external electrode pad 150 and surround a side wall of the first conductive via pattern 123.

The first conductive line pattern 121 and the first conductive via pattern 123 may be arranged on the first seed layer 125. The first conductive line pattern 121 and the first conductive via pattern 123 may be integrally formed together using a plating process. The first conductive line pattern 121 may be arranged on the first conductive via pattern 123 and a portion of the first seed layer 125 on the top surface of the first insulating layer 111. The first conductive via pattern 123 may cover a portion of the first seed layer 125 in the first via opening VO1 and fill the first via opening VO1. The first conductive via pattern 123 may extend in a vertical direction penetrating the first insulating layer 111 and be connected to the first conductive line pattern 121 and the external electrode pad 150.

In example embodiments, the first conductive via pattern 123 may have a shape, of which the width in a horizontal direction decreases in a direction from a first surface 118 of the redistribution insulating layer 110 toward a second surface 119 thereof (or in a direction away from the semiconductor chip 200).

The second insulating layer 113, which covers a portion of the first conductive line pattern 121 and has a second via opening (VO2 in FIG. 9E) on/exposing another portion of the first conductive line pattern 121, may be stacked on the first insulating layer 111.

The second seed layer 135 may be arranged on a portion of a top surface of the second insulating layer 113, an inner wall of the second via opening VO2, and a portion of a top surface of the first conductive line pattern 121, which is exposed through the second via opening VO2. A portion of the second seed layer 135 may be between the second conductive line pattern 131 and the top surface of the second insulating layer 113. Another portion of the second seed layer 135 may be arranged between the second conductive via pattern 133 and the first conductive line pattern 121 and surround a side wall of the second conductive via pattern 133.

The second conductive via pattern 133 and the second conductive line pattern 131 may be arranged on the second seed layer 135. The second conductive via pattern 133 and the second conductive line pattern 131 may be integrally formed together using a plating process. The second conductive line pattern 131 may be arranged on the second conductive via pattern 133 and a portion of the second seed layer 135 on the top surface of the second insulating layer 113. The second conductive via pattern 133 may cover a portion of the second seed layer 135 in the second via opening VO2 and fill the second via opening VO2. The second conductive via pattern 133 may extend in the vertical direction penetrating the second insulating layer 113 and be connected to the second conductive line pattern 131 and the first conductive line pattern 121.

In example embodiments, the second conductive via pattern 133 may have a shape, of which the width in the horizontal direction decreases in the direction from the first surface 118 of the redistribution insulating layer 110 toward the second surface 119 thereof.

The third insulating layer 115, which covers a portion of the second conductive line pattern 131 and has a third via opening (VO3 in FIG. 9E) on/exposing another portion of the second conductive line pattern 131, may be stacked on the second insulating layer 113.

The third seed layer 145 may be arranged on a portion of a top surface of the third insulating layer 115, an inner wall of the third via opening VO3, and a portion of a top surface of the second conductive line pattern 131, which is exposed through the third via opening VO3. A portion of the third seed layer 145 may be between the third conductive line pattern 141 and the top surface of the third insulating layer 115. Another portion of the third seed layer 145 may be arranged between the third conductive via pattern 143 and the second conductive line pattern 131 and surround a side wall of the third conductive via pattern 143.

The third conductive via pattern 143 and the third conductive line pattern 141 may be arranged on the third seed layer 145. The third conductive via pattern 143 and the third conductive line pattern 141 may be integrally formed together using a plating process. The third conductive line pattern 141 may be arranged on the third conductive via pattern 143 and a portion of the third seed layer 145 on the top surface of the third insulating layer 115. The third conductive via pattern 143 may cover a portion of the third seed layer 145 in the third via opening VO3 and fill the third via opening VO3. The third conductive via pattern 143 may extend in the vertical direction penetrating the third insulating layer 115 and be connected to the third conductive line pattern 141 and the second conductive line pattern 131.

In example embodiments, the third conductive via pattern 143 may have a shape, of which the width in the horizontal direction decreases in the direction from the first surface 118 of the redistribution insulating layer 110 toward the second surface 119 thereof.

A portion of the third conductive line pattern 141 of the third redistribution pattern 140 may be arranged below the semiconductor chip 200 and may function as a pad, to which a chip connector 230 is attached. In addition, another portion of the third conductive line pattern 141 of the third redistribution pattern 140 may be separated from a side surface of the semiconductor chip 200 in the horizontal direction and may function as a pad, to which the conductive post 160 is attached.

Although the redistribution structure 101 includes three insulating layers, that is, the first through third insulating layers 111, 113, and 115, three conductive line patterns, that is, the first through third conductive line patterns 121, 131, and 141, and three conductive via patterns, that is, the first through third conductive via patterns 123, 133, and 143 in FIG. 1, the inventive concepts are not limited thereto. The numbers of insulating layers, conductive line patterns, and conductive via patterns may vary with the design of circuit wiring in the redistribution structure 101.

The semiconductor chip 200 may be attached to the redistribution structure 101. For example, the semiconductor chip 200 may be mounted on the redistribution structure 101 in a flip-chip manner.

The semiconductor chip 200 may include a memory chip or a logic chip. The memory chip may include, for example, a volatile memory chip such as dynamic random access memory (DRAM) or static RAM (SRAM) or a non-volatile memory chip such as phase-change RAM (PRAM), magnetoresistive RAM (MRAM), ferroelectric RAM (FeRAM), or resistive RAM (RRAM). In some embodiments, the memory chip may include a high bandwidth memory (HBM) DRAM semiconductor chip. The logic chip may include, for example, a micro processor, an analog device, or a digital signal processor.

The semiconductor chip 200 may include a semiconductor substrate 210 and a chip pad 220 in a surface of the semiconductor substrate 210.

The semiconductor substrate 210 may include, for example, silicon (Si). The semiconductor substrate 210 may include a semiconductor element, e.g., germanium (Ge), or a compound semiconductor such as silicon carbide (SiC), gallium arsenide (GaAs), indium arsenide (InAs), or indium phosphide (InP). The semiconductor substrate 210 may have an active side and an inactive side opposite to the active side. In example embodiments, the active side of the semiconductor substrate 210 may face the redistribution structure 101.

A semiconductor device including various kinds of individual devices may be formed in the active side of the semiconductor substrate 210 of the semiconductor chip 200.

The chip connector 230 may be arranged between the chip pad 220 of the semiconductor chip 200 and the third conductive line pattern 141. The chip connector 230 may electrically connect the chip pad 220 of the semiconductor chip 200 to the third conductive line pattern 141. The chip connector 230 may include, for example, at least one selected from a pillar structure, a solder bump, a solder ball, and a solder layer.

The semiconductor chip 200 may receive at least one selected from a control signal, a power signal, and a ground signal for the operation of the semiconductor chip 200 or a data signal to be stored in the semiconductor chip 200 from outside the semiconductor package 10 or provide data stored in the semiconductor chip 200 to outside the semiconductor package 10 through the chip connector 230, the first through third redistribution patterns 120, 130, and 140, the external electrode pad 150, and the external connector 190.

An underfill material layer 240 may be arranged between the semiconductor chip 200 and the redistribution structure 101 to surround the chip connector 230. The underfill material layer 240 may include, for example, epoxy resin formed using a capillary underfill process. In example embodiments, the underfill material layer 240 may include a non-conductive film (NCF).

The molding layer 250 may be arranged on the first surface 118 of the redistribution structure 101 and may cover at least a portion of the semiconductor chip 200 and a side surface of the conductive post 160. The molding layer 250 may include, for example, an epoxy molding compound (EMC). The molding layer 250 may not be limited to an EMC and may include various materials such as an epoxy material, a thermosetting material, a thermoplastic material, and an ultraviolet (UV) treated material.

In example embodiments, the molding layer 250 may cover a portion of the first surface 118 of the redistribution insulating layer 110 and a side surface of the semiconductor chip 200. A top surface 251 of the molding layer 250 may be coplanar with a top surface of the semiconductor chip 200. At this time, the top surface of the semiconductor chip 200 may be exposed to elements outside of the semiconductor package 10. In some embodiments, first and second molding layers 250 may be on opposite first and second side surfaces of the lower semiconductor chip 200 and may have first and second conductive posts 160, respectively, therein. Each conductive post 160 may have a top surface 161 that is at a lower level than an adjacent top surface 251 of a molding layer 250.

The conductive post 160 may be separated from the side surface of the semiconductor chip 200 in the horizontal direction and may have a post or pillar shape extending in the vertical direction and penetrating the molding layer 250. The conductive post 160 may be arranged on the third redistribution pattern 140 that functions as a pad. The conductive post 160 may be electrically connected to the semiconductor chip 200 through at least a portion of the first through third redistribution patterns 120, 130, and 140 and electrically connected to the external connector 190 through at least a portion of the first through third redistribution patterns 120, 130, and 140 and the external electrode pad 150.

For example, the conductive post 160 may include Cu but is not limited thereto.

The molding layer 250 may include a recess 257 to expose a top surface 161 of the conductive post 160 and an inner wall 253 provided by the recess 257. A corner portion 255 at which the top surface 251 of the molding layer 250 meets the inner wall 253 of the molding layer 250 may be chamfered or rounded. In some embodiments, the molding layer 250 may include first and second inner walls 253 that are opposite each other (in a cross-sectional view), and the conductive post 160 may extend continuously from the first inner wall 253 to the second inner wall 253.

In example embodiments, the top surface 161 of the conductive post 160 may have a concave shape overall. In other words, a central portion of the top surface 161 of the conductive post 160 may be recessed such that the central portion of the top surface 161 of the conductive post 160 may be lower than an edge portion of the top surface 161 of the conductive post 160.

At this time, the top surface 161 of the conductive post 160 may be at a lower level than the top surface 251 of the molding layer 250. In example embodiments, a distance between the center of the top surface 161 of the conductive post 160 and the top surface 251 of the molding layer 250 in the vertical direction may be about 1 micrometers (μm) to about 100 μm.

Figure 3:
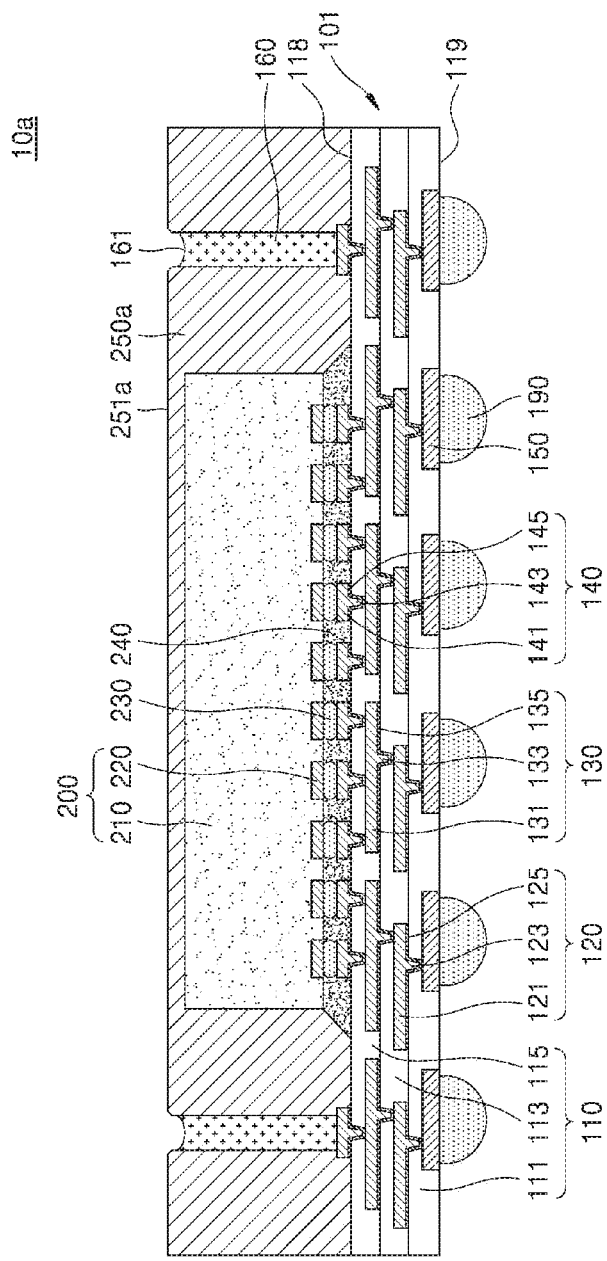
FIG. 3 is a cross-sectional view of a semiconductor package according to example embodiments.

FIG. 3 is a cross-sectional view of a semiconductor package 10a according to example embodiments.

The semiconductor package 10a of FIG. 3 may be the same as or similar to the semiconductor package 10 described with reference to FIGS. 1 and 2, except for a molding layer 250a. For convenience of description, the description will be focused on differences between the semiconductor package 10a and the semiconductor package 10 described with reference to FIGS. 1 and 2.

Referring to FIG. 3, the semiconductor package 10a may include the redistribution structure 101, the semiconductor chip 200, the conductive post 160, and the molding layer 250a. The molding layer 250a may cover the side surface and the top surface of the semiconductor chip 200 and the side surface of the conductive post 160. The molding layer 250a may include a planarized top surface. A top surface 251a of the molding layer 250a may be at a higher level than the top surface of the semiconductor chip 200. The top surface 251a of the molding layer 250a may also be at a higher level than the top surface 161 of the conductive post 160.

Figure 4:
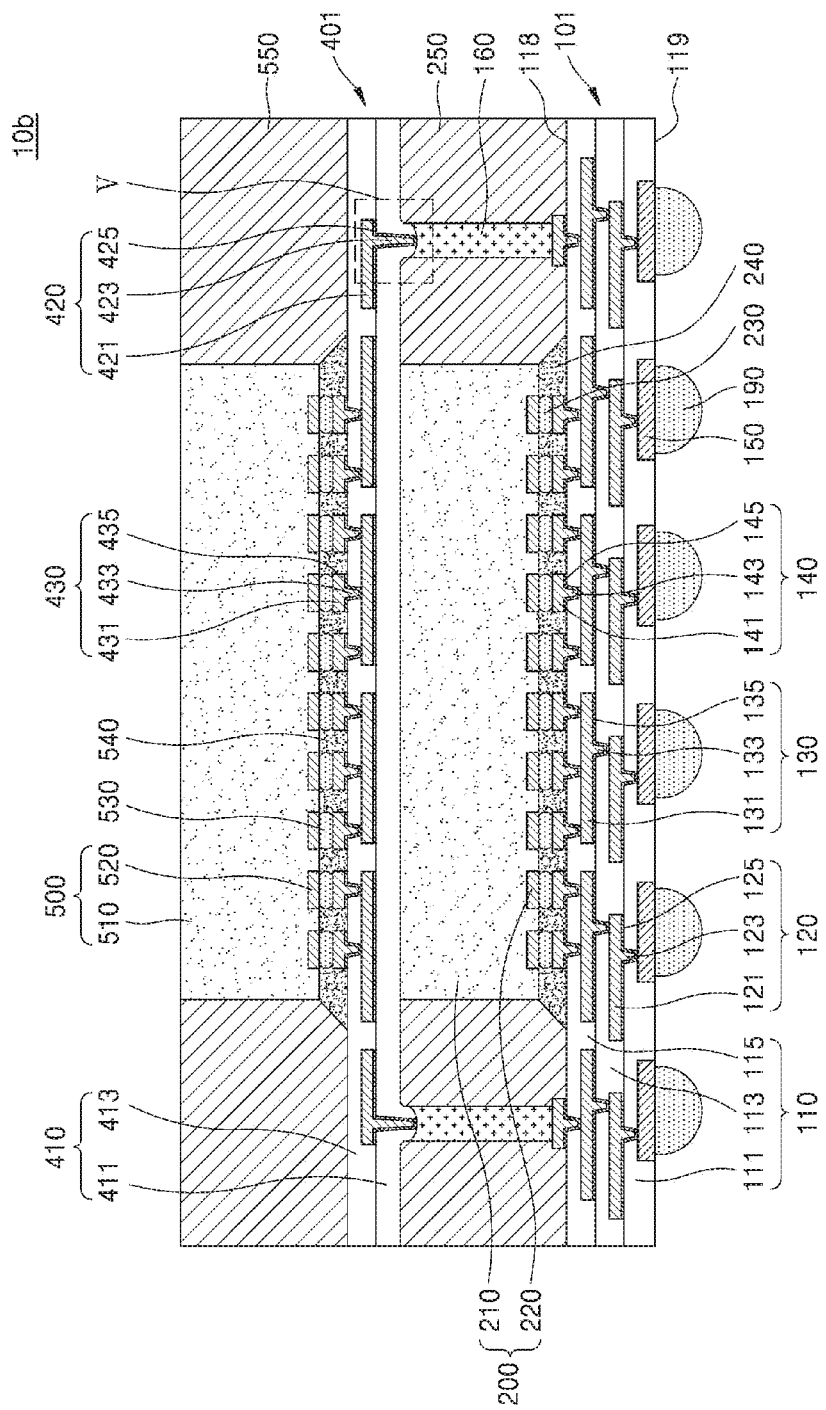
FIG. 4 is a cross-sectional view of a semiconductor package according to example embodiments.
Figure 5:
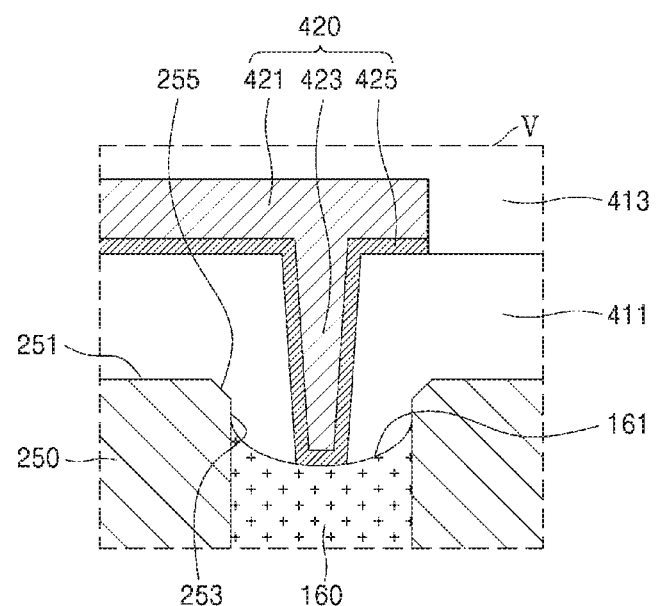
FIG. 5 is an enlarged cross-sectional view of a region V in FIG. 4.

FIG. 4 is a cross-sectional view of a semiconductor package 10b according to example embodiments. FIG. 5 is an enlarged cross-sectional view of a region V in FIG. 4.

The semiconductor package 10b shown in FIGS. 4 and 5 may be the same as or similar to the semiconductor package 10 described with reference to FIGS. 1 and 2, except that the semiconductor package 10b further includes an upper redistribution structure 401 and an upper semiconductor chip 500. For convenience of description, the description will be focused on differences between the semiconductor package 10b and the semiconductor package 10 described with reference to FIGS. 1 and 2.

Referring to FIGS. 4 and 5, the semiconductor package 10b may include the redistribution structure 101, the semiconductor chip 200, the conductive post 160, the molding layer 250, the upper redistribution structure 401, the upper semiconductor chip 500, and an upper molding layer 550.

The redistribution structure 101 may include the redistribution insulating layer 110, the first through third redistribution patterns 120, 130, and 140, and the external electrode pad 150. The redistribution structure 101 of FIG. 4 may be substantially the same as or similar to the redistribution structure 101 described with reference to FIGS. 1 and 2. The semiconductor chip 200, the conductive post 160, and the molding layer 250 shown in FIGS. 4 and 5 may be substantially the same as or similar to the semiconductor chip 200, the conductive post 160, and the molding layer 250 described with reference to FIGS. 1 and 2.

The upper redistribution structure 401 may include an upper redistribution insulating layer 410 and a plurality of upper redistribution patterns, e.g., first and second upper redistribution patterns 420 and 430. The plurality of upper redistribution patterns may be electrically connected to the third redistribution pattern 130 of the redistribution structure 101 through the conductive post 160.

The upper redistribution insulating layer 410 may include a plurality of upper insulating layers, e.g., first and second upper insulating layers 411 and 413, sequentially stacked on the semiconductor chip 200 and the molding layer 250. For example, the first and second upper insulating layers 411 and 413 may include a PID material, e.g., photosensitive polyimide. Alternatively, the first and second upper insulating layers 411 and 413 may include oxide or nitride.

The first and second upper redistribution patterns 420 and 430 may include first and second upper conductive line patterns 421 and 431, respectively, and first and second upper conductive via patterns 423 and 433, respectively. Each of the first and second upper conductive line patterns 421 and 431 may be arranged on at least one selected from a top surface and a bottom surface of a corresponding one of the first and second upper insulating layers 411 and 413. The first and second upper conductive via patterns 423 and 433 may penetrate at least one selected from the first and second upper insulating layers 411 and 413. The first and second upper conductive via patterns 423 and 433 may be connected to at least one selected from the first and second upper conductive line patterns 421 and 431 or the top surface 161 of the conductive post 160.

For example, the upper redistribution insulating layer 410 may include the first upper insulating layer 411 and the second upper insulating layer 413, which are sequentially stacked on the semiconductor chip 200 and the molding layer 250.

The first upper insulating layer 411 may cover the top surface of the semiconductor chip 200 and the top surface 251 of the molding layer 250. The first upper insulating layer 411 may fill the recess (257 in FIG. 2) of the molding layer 250. A portion of the first upper insulating layer 411, which fills the recess of the molding layer 250, may cover the inner wall 253 of the molding layer 250 and the top surface 161 of the conductive post 160. Since the first upper insulating layer 411 fills the recess of the molding layer 250, a contact area between the first upper insulating layer 411 and the molding layer 250 increases, and accordingly, an adhesive strength of the first upper insulating layer 411 to the molding layer 250 may increase and delamination of the first upper insulating layer 411 may be inhibited/prevented.

In addition, since the molding layer 250 has the corner portion 255 that is chamfered or rounded, the concentration of stress on the corner portion 255 may be reduced/prevented and occurrence of a crack near the corner portion 255 of the molding layer 250 due to the concentration of stress may be inhibited/prevented.

The first upper redistribution pattern 420 may include the first upper conductive line pattern 421, the first upper conductive via pattern 423, and a first upper seed layer 425. The second upper redistribution pattern 430 may include the second upper conductive line pattern 431, the second upper conductive via pattern 433, and a second upper seed layer 435.

The first upper insulating layer 411 may include a via opening that exposes a portion of the top surface 161 of the conductive post 160. The first upper seed layer 425 may be arranged on a portion of a top surface of the first upper insulating layer 411, an inner wall of the via opening of the first upper insulating layer 411, and a portion of the top surface 161 of the conductive post 160, which is exposed through the via opening of the first upper insulating layer 411. A portion of the first upper seed layer 425 may be between the first upper conductive line pattern 421 and the top surface of the first upper insulating layer 411, and another portion of the first upper seed layer 425 may be arranged between the first upper conductive via pattern 423 and the top surface 161 of the conductive post 160 to surround a side wall of the first upper conductive via pattern 423.

The first upper conductive line pattern 421 and the first upper conductive via pattern 423 may be arranged on the first upper seed layer 425. The first upper conductive line pattern 421 and the first upper conductive via pattern 423 may be integrally formed together using a plating process. The first upper conductive line pattern 421 may be arranged on the first upper conductive via pattern 423 and a portion of the first upper seed layer 425 on the top surface of the first upper insulating layer 411. The first upper conductive via pattern 423 may cover a portion of the first upper seed layer 425 in the via opening of the first upper insulating layer 411 and fill the via opening of the first upper insulating layer 411. The first upper conductive via pattern 423 may extend in the vertical direction penetrating the first upper insulating layer 411 and electrically connect the first upper conductive line pattern 421 to the conductive post 160.

In example embodiments, the first upper conductive via pattern 423 may have a shape, of which the horizontal width increases away from the top surface 161 of the conductive post 160. Accordingly, the horizontal width of the first upper conductive via pattern 423 may be tapered toward the top surface 161 of the conductive post 160.

The second upper insulating layer 413, which covers a portion of the first upper conductive line pattern 421 and has a via opening exposing another portion of the first upper conductive line pattern 421, may be stacked on the first upper insulating layer 411.

The second upper seed layer 435 may be arranged on a portion of a top surface of the second upper insulating layer 413, an inner wall of the via opening of the second upper insulating layer 413, and a portion of a top surface of the first upper conductive line pattern 421, which is exposed through the via opening of the second upper insulating layer 413. A portion of the second upper seed layer 435 may be between the second upper conductive line pattern 431 and the top surface of the second upper insulating layer 413, and another portion of the second upper seed layer 435 may be arranged between the second upper conductive via pattern 433 and the first upper conductive line pattern 421 to surround a side wall of the second upper conductive via pattern 433.

The second upper conductive via pattern 433 and the second upper conductive line pattern 431 may be arranged on the second upper seed layer 435. The second upper conductive via pattern 433 and the second upper conductive line pattern 431 may be integrally formed together using a plating process. The second upper conductive line pattern 431 may be arranged on the second upper conductive via pattern 433 and a portion of the second upper seed layer 435 on the top surface of the second upper insulating layer 413. The second upper conductive via pattern 433 may cover a portion of the second upper seed layer 435 in the via opening of the second upper insulating layer 413 and fill the via opening of the second upper insulating layer 413. The second upper conductive via pattern 433 may extend in the vertical direction penetrating the second upper insulating layer 413 and electrically connect the second upper conductive line pattern 431 to the first upper conductive line pattern 421.

The upper semiconductor chip 500 may be attached to the upper redistribution structure 401. For example, the upper semiconductor chip 500 may be mounted on the upper redistribution structure 401 in a flip-chip manner. The upper semiconductor chip 500 may include a semiconductor substrate 510 and a chip pad 520. A chip connector 530 may be arranged between the chip pad 520 of the upper semiconductor chip 500 and the second upper redistribution pattern 430 of the upper redistribution structure 401. The chip connector 530 may electrically connect the chip pad 520 of the upper semiconductor chip 500 to the second upper redistribution pattern 430. An underfill material layer 540 may be arranged between the upper semiconductor chip 500 and the upper redistribution structure 401 to surround the chip connector 530. The upper molding layer 550 covering at least a portion of the upper semiconductor chip 500 may be arranged on the upper redistribution structure 401.

In example embodiments, the semiconductor chip 200 and the upper semiconductor chip 500 may be of different types. For example, when the semiconductor chip 200 is a logic chip, the upper semiconductor chip 500 may be a memory chip. In example embodiments, the semiconductor package 10b may include a system-in-package (SIP), in which different types of semiconductor chips are electrically connected to each other and operate as a single system. In example embodiments, the semiconductor chip 200 and the upper semiconductor chip 500 may be of the same types.

Figure 6:
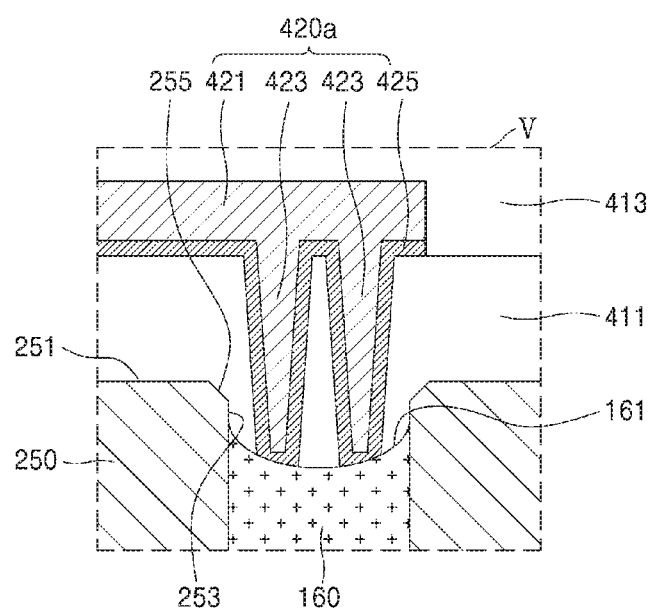
FIG. 6 is an enlarged cross-sectional view of a portion corresponding to the region V in FIG. 4.

FIG. 6 is an enlarged cross-sectional view of the region V in FIG. 4.

Referring to FIG. 6, a first upper redistribution pattern 420a may include a plurality of first upper conductive via patterns 423 connected to the first upper conductive line pattern 421. For example, two to five first upper conductive via patterns 423 may be connected to the first upper conductive line pattern 421.

The first upper conductive via patterns 423 may be separated from each other in the horizontal direction and may extend in the vertical direction penetrating the first upper insulating layer 411. The first upper conductive via patterns 423 may be connected to the top surface 161 of the conductive post 160 so as to electrically connect the first upper conductive line pattern 421 to the conductive post 160.

Figure 7:
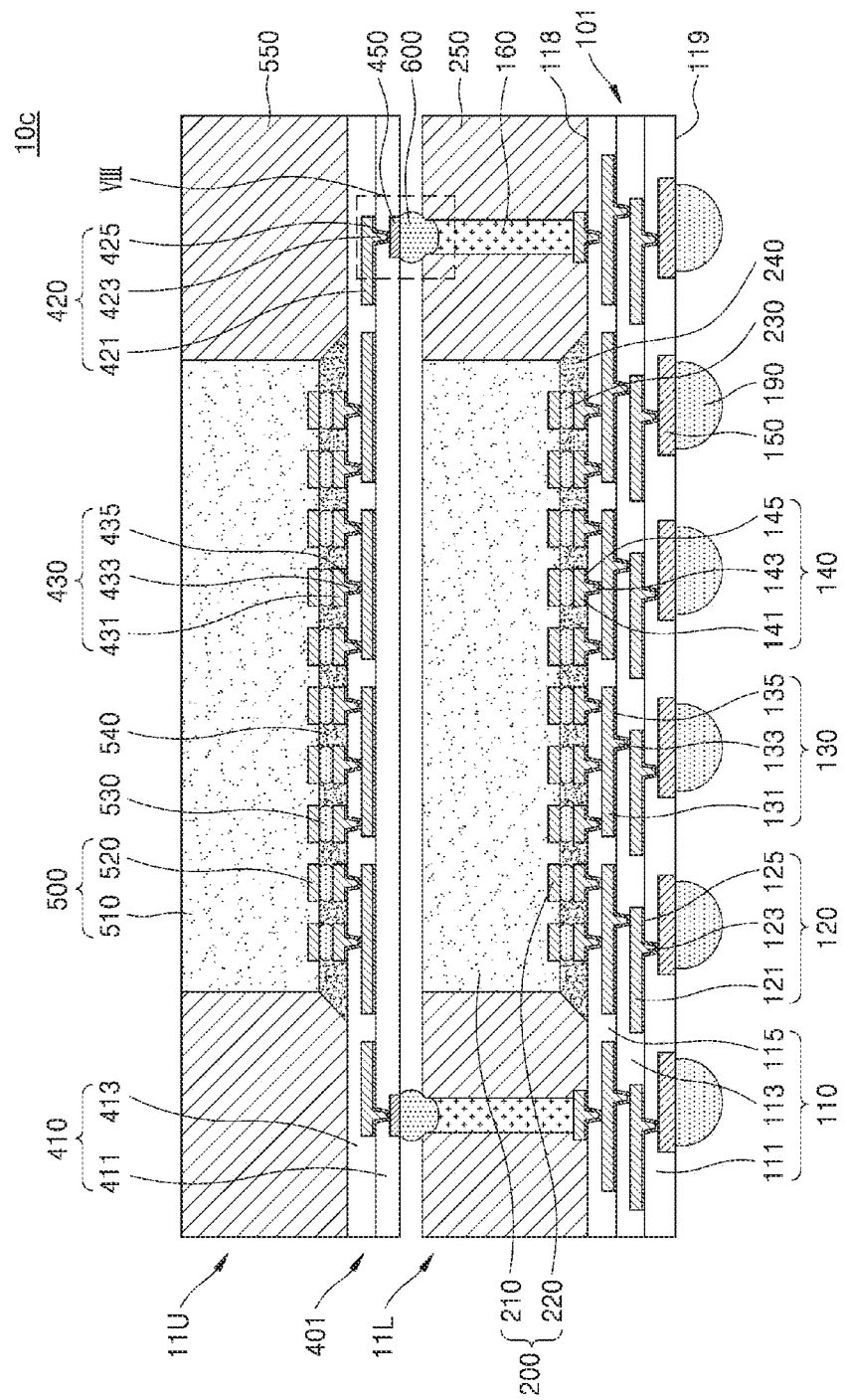
FIG. 7 is a cross-sectional view of a semiconductor package according to example embodiments.
Figure 8:
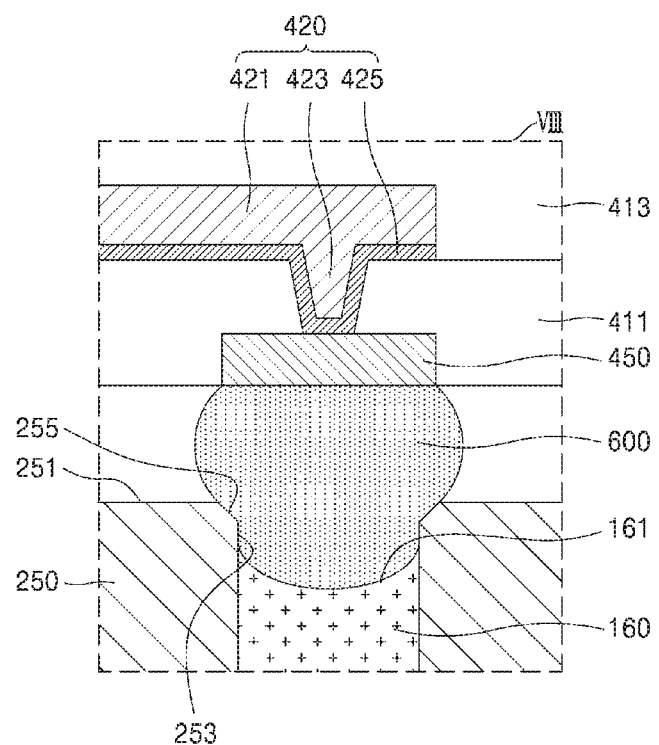
FIG. 8 is an enlarged cross-sectional view of a region VIII in FIG. 7.

FIG. 7 is a cross-sectional view of a semiconductor package 10c according to example embodiments. FIG. 8 is an enlarged cross-sectional view of a region VIII in FIG. 7. For convenience of description, redundant descriptions already given above will be brief or omitted.

Referring to FIGS. 7 and 8, the semiconductor package 10c may include a lower package 11L and an upper package 11U on the lower package 11L. The semiconductor package 10c may be a package-on-package type, in which the upper package 11U is attached to the lower package 11L.

The lower package 11L may include the redistribution structure 101, the semiconductor chip 200, the conductive post 160, and the molding layer 250. The lower package 11L may be substantially the same as or similar to the semiconductor package 10 described with reference to FIGS. 1 and 2.

The upper package 11U may include the upper redistribution structure 401, the upper semiconductor chip 500, the chip connector 530, the underfill material layer 540, and the upper molding layer 550. The upper semiconductor chip 500, the chip connector 530, the underfill material layer 540, and the upper molding layer 550 may be substantially the same as or similar to the upper semiconductor chip 500, the chip connector 530, the underfill material layer 540, and the upper molding layer 550, which have been described with reference to FIGS. 4 and 5.

The upper redistribution structure 401 of the upper package 11U may include the upper redistribution insulating layer 410, the plurality of upper redistribution patterns, e.g., first and second upper redistribution patterns 420 and 430, and an electrode pad 450.

For example, the upper redistribution insulating layer 410 may include the first upper insulating layer 411 and the second upper insulating layer 413, which are sequentially stacked on the lower package 11L.

For example, the first upper redistribution pattern 420 may include the first upper conductive line pattern 421, the first upper conductive via pattern 423, and the first upper seed layer 425. The first upper conductive line pattern 421 may extend along the top surface of the first upper insulating layer 411, and the first upper conductive via pattern 423 may partially penetrate the first upper insulating layer 411 and extend between the first upper conductive line pattern 421 and the electrode pad 450 in the vertical direction. A portion of the first upper seed layer 425 may be between the first upper conductive line pattern 421 and the first upper insulating layer 411 and another portion of the first upper seed layer 425 may be arranged between the first upper conductive via pattern 423 and the electrode pad 450 to surround the side wall of the first upper conductive via pattern 423.

For example, the second upper redistribution pattern 430 may include the second upper conductive line pattern 431, the second upper conductive via pattern 433, and the second upper seed layer 435. The second upper conductive line pattern 431 may extend along the top surface of the second upper insulating layer 413, and the second upper conductive via pattern 433 may penetrate the second upper insulating layer 413 and extend between the second upper conductive line pattern 431 and the first upper conductive line pattern 421 in the vertical direction. A portion of the second upper seed layer 435 may be between the second upper conductive line pattern 431 and the second upper insulating layer 413 and another portion of the second upper seed layer 435 may be arranged between the second upper conductive via pattern 433 and the first upper conductive line pattern 421 to surround a side wall of the second upper conductive via pattern 433.

The upper package 11U may be electrically and/or physically connected to the lower package 11L via an interpackage connector 600 between the upper package 11U and the lower package 11L. The interpackage connector 600 may be in contact with the electrode pad 450 of the upper redistribution structure 401 and the conductive post 160 and electrically connect the electrode pad 450 of the upper redistribution structure 401 to the conductive post 160.

In example embodiments, the interpackage connector 600 may fill the recess (257 in FIG. 2) of the molding layer 250. The interpackage connector 600 may cover the inner wall 253 of the molding layer 250 and the top surface 161 of the conductive post 160. Since the top surface 161 of the conductive post 160 has a concave shape overall, a contact area between the top surface 161 of the conductive post 160 and the interpackage connector 600 may increase, and accordingly, contact resistance between the conductive post 160 and the interpackage connector 600 may decrease. As a result, the electric characteristics of the semiconductor package 10c may be enhanced.

In addition, since the interpackage connector 600 fills the recess of the molding layer 250, a contact area between the interpackage connector 600 and the molding layer 250 may increase, and accordingly, an adhesive strength between the interpackage connector 600 and the molding layer 250 may increase.

Figure 9A:
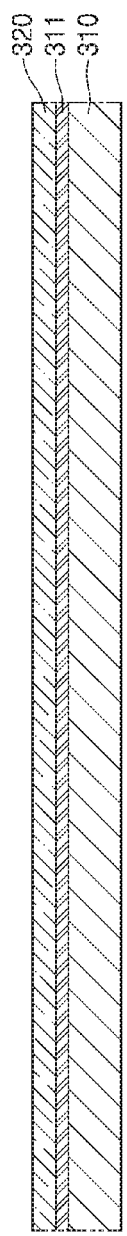
FIGS. 9A through 9O are cross-sectional views of sequential stages in a method of manufacturing a semiconductor package, according to example embodiments.

FIGS. 9A through 9O are cross-sectional views of sequential stages in a method of manufacturing a semiconductor package, according to example embodiments. Hereinafter, a method of manufacturing the semiconductor package 10b of FIG. 4 will be described with reference to FIGS. 9A through 9O.

Referring to FIG. 9A, a cover layer 320 is formed on a carrier substrate 310, to which a release film 311 is attached. The cover layer 320 may include the same insulating material as or a different insulating material than the redistribution insulating layer 110 (in FIG. 4). For example, the cover layer 320 may include a material film including an organic compound. In example embodiments, the cover layer 320 may include photosensitive polyimide. Alternatively, the cover layer 320 may include oxide or nitride.

The carrier substrate 310 may include a material that has stability with respect to a baking process and an etching process. In the case where the carrier substrate 310 is separated and removed by laser ablation afterward, the carrier substrate 310 may include a transparent substrate. Optionally, in the case where the carrier substrate 310 is separated and removed by heating, the carrier substrate 310 may include a heat resistant substrate. In example embodiments, the carrier substrate 310 may include a glass substrate. In example embodiments, the carrier substrate 310 may include heat resistant organic polymer material, such as polyimide, poly(etheretherketone) (PEEK), poly(ethersulfone) (PES), or poly(phenylene sulfide) (PPS), but is not limited thereto.

The release film 311 may include, for example, a laser reactive layer that reacts to laser radiation and evaporates such that the carrier substrate 310 is separable. The release film 311 may include a carbon material layer. For example, the release film 311 may include an amorphous carbon layer (ACL), a hydrocarbon compound having a relatively high carbon content of about 85 wt % to about 99 wt % based on the total weight thereof, or a spin-on hardmask (SOH) including a derivative thereof.

Figure 9B:
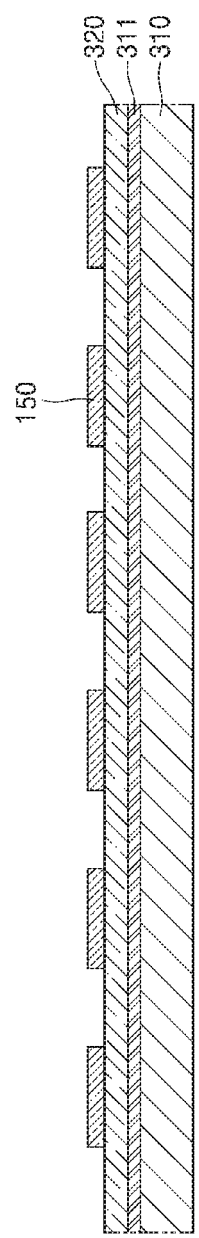

Referring to FIG. 9B, the external electrode pad 150 is formed on the cover layer 320. To form the external electrode pad 150, a conductive material film may be formed on the cover layer 320 and patterned. The external electrode pad 150 may be formed to have a uniform thickness overall on a top surface of the cover layer 320, and a bottom surface of the external electrode pad 150, which is in contact with the top surface of the cover layer 320, may be flat.

In example embodiments, the external electrode pad 150 may include a single metal material. In example embodiments, the external electrode pad 150 may have a multilayer structure, in which multiple layers respectively include different metal materials.

Figure 9C:
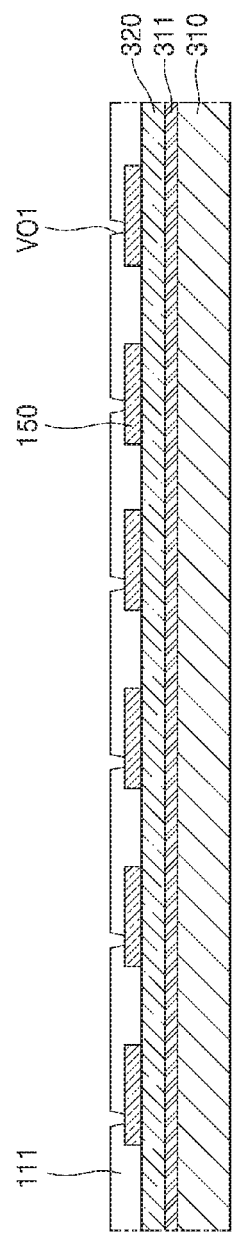

Referring to FIG. 9C, after the external electrode pad 150 is formed, the first insulating layer 111, which includes the first via opening VO1 exposing a portion of the external electrode pad 150, is formed. For example, to form the first insulating layer 111, an insulating material film covering the external electrode pad 150 and the cover layer 320 may be formed, and a portion of the insulating material film may be removed using exposure and development to form the first via opening VO1. The portion of the external electrode pad 150 may be exposed through the first via opening VO1.

For example, to form the first via opening VO1, reactive ion etching (ME) using plasma, laser drilling, or the like may be performed. The first via opening VO1 may have a shape, of which the horizontal width decreases downward (toward the external electrode pad 150).

Figure 9D:
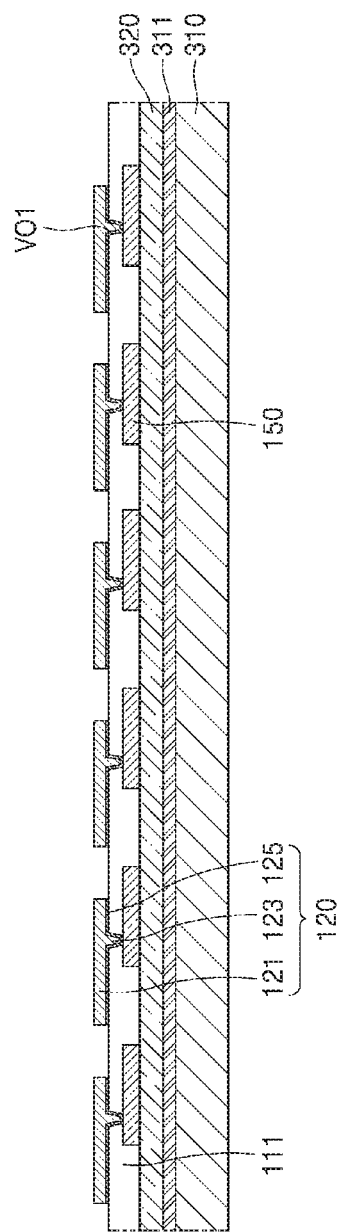

Referring to FIG. 9D, the first seed layer 125, the first conductive line pattern 121, and the first conductive via pattern 123 are formed on a resultant structure of FIG. 9C.

In detail, a seed metal film is formed on the top surface of first insulating layer 111, an inner wall of the first insulating layer 111 provided by the first via opening VO1, and the external electrode pad 150 exposed through the first via opening VO1. For example, the seed metal film may be formed using physical vapor deposition. After the seed metal film is formed, a photoresist pattern including an opening is formed and a plating process is performed using the seed metal film as a seed such that the first conductive line pattern 121 and the first conductive via pattern 123 are formed. Thereafter, the photoresist pattern is removed, and a portion of the seed metal film exposed by removing the photoresist pattern is removed. As a result of removing the seed metal film, the first seed layer 125 may be formed between the top surface of the first insulating layer 111 and the first conductive line pattern 121, between the first conductive via pattern 123 and an inner wall of the first insulating layer 111, the inner wall being provided by the first via opening VO1, and between the first conductive via pattern 123 and the external electrode pad 150. The first seed layer 125, the first conductive line pattern 121, and the first conductive via pattern 123 may form the first redistribution pattern 120.

Figure 9E:
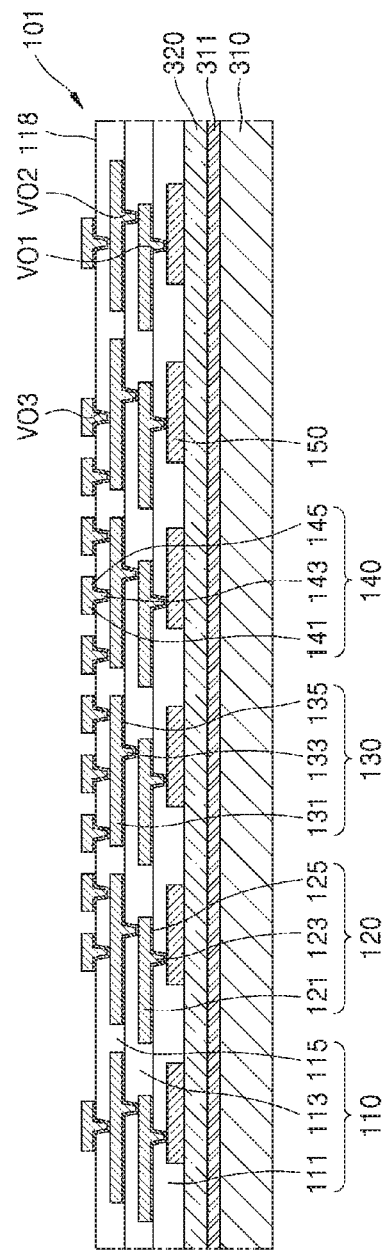

Referring to FIG. 9E, the second insulating layer 113 including the second via opening VO2, the second redistribution pattern 130, the third insulating layer 115 including the third via opening VO3, and the third redistribution pattern 140 may be sequentially formed on a resultant structure of FIG. 9D using a procedure which is substantially the same as or similar to that described with reference to FIGS. 9C and 9D. The first through third insulating layers 111, 113, and 115 and the first through third redistribution patterns 120, 130, and 140 may form the redistribution structure 101.

In detail, the second seed layer 135 may be formed to cover the top surface of the second insulating layer 113, an inner wall of the second insulating layer 113, the inner wall being provided by the second conductive via pattern 133 and the second via opening VO2, and a portion of the first conductive line pattern 121, the portion being exposed through the second via opening VO2. The second conductive line pattern 131 may extend along the top surface of the second insulating layer 113, and the second conductive via pattern 133 may fill the second via opening VO2. The second seed layer 135, the second conductive line pattern 131, and the second conductive via pattern 133 may form the second redistribution pattern 130.

The third seed layer 145 may be formed to cover the top surface of the third insulating layer 115, an inner wall of the third insulating layer 115, the inner wall being provided by the third conductive via pattern 143 and the third via opening VO3, and a portion of the second conductive line pattern 131, the portion being exposed through the third via opening VO3. The third conductive line pattern 141 may extend along the top surface of the third insulating layer 115, and the third conductive via pattern 143 may fill the third via opening VO3. The third seed layer 145, the third conductive line pattern 141, and the third conductive via pattern 143 may form the third redistribution pattern 140.

Figure 9F:
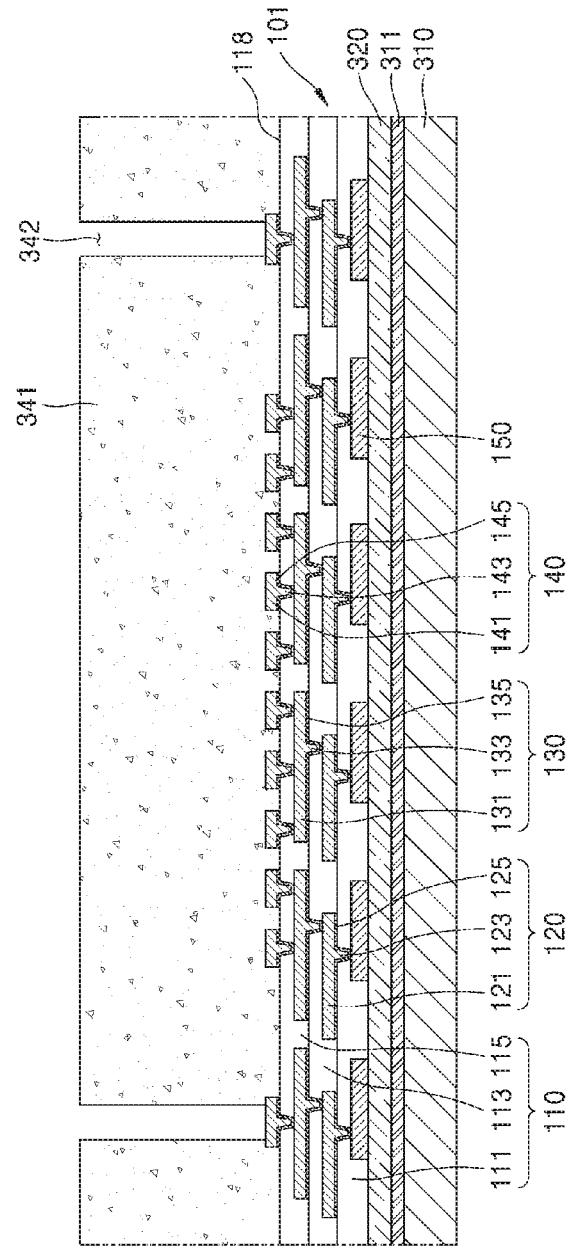

Referring to FIG. 9F, a photoresist pattern 341 is formed on the first surface 118 of the redistribution insulating layer 110. The photoresist pattern 341 may include an opening 342 that exposes a portion of the third conductive line pattern 141 of the third redistribution pattern 140. The opening 342 of the photoresist pattern 341 may define a region, in which the conductive post 160 (in FIG. 9G) is formed in a succeeding process.

Figure 9G:
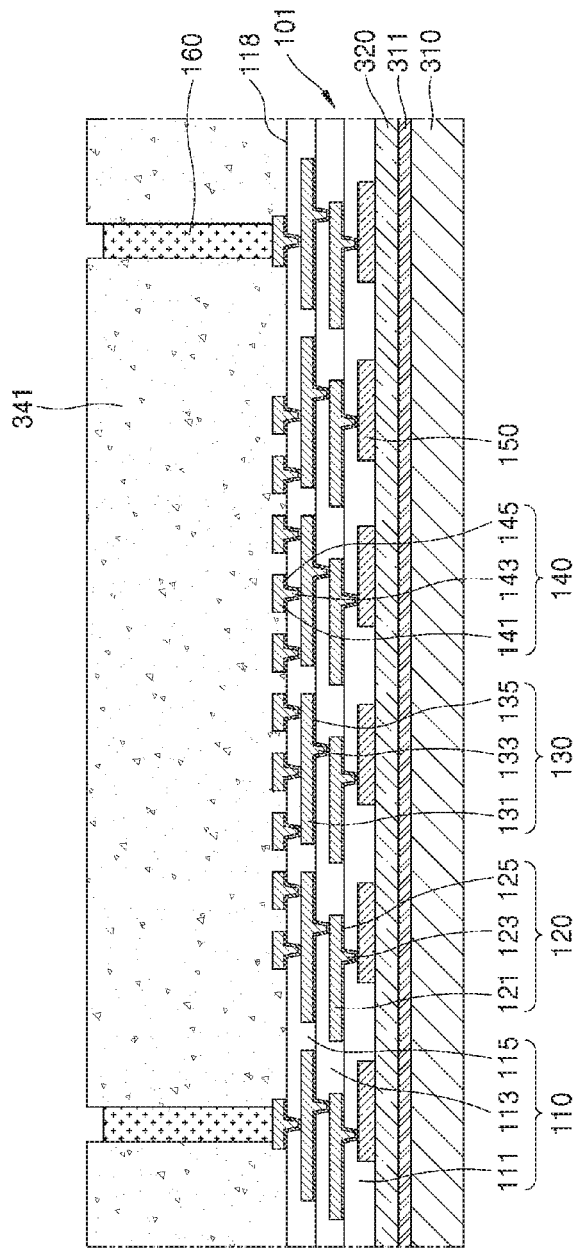

Referring to FIGS. 9G and 9F, the conductive post 160 is formed in the opening 342 of the photoresist pattern 341. The conductive post 160 may be formed on the portion of the third conductive line pattern 141 of the third redistribution pattern 140, the portion being exposed through the opening 342 of the photoresist pattern 341, to at least partially fill the opening 342 of the photoresist pattern 341. The conductive post 160 may include Cu but is not limited thereto.

Figure 9H:
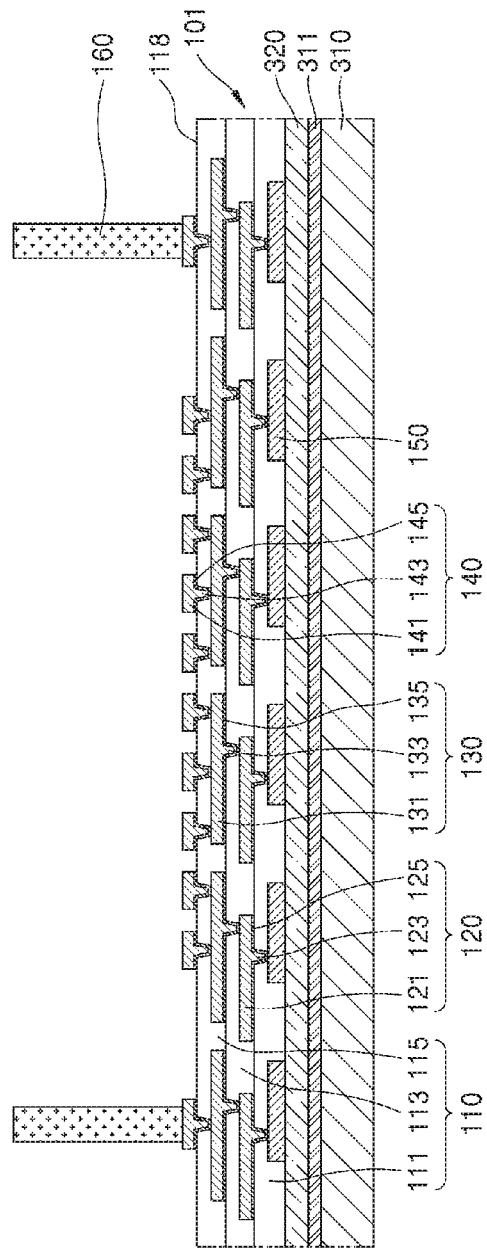

Referring to FIGS. 9H and 9G, the photoresist pattern 341 is removed. For example, the photoresist pattern 341 may be removed using a strip process.

Figure 9I:
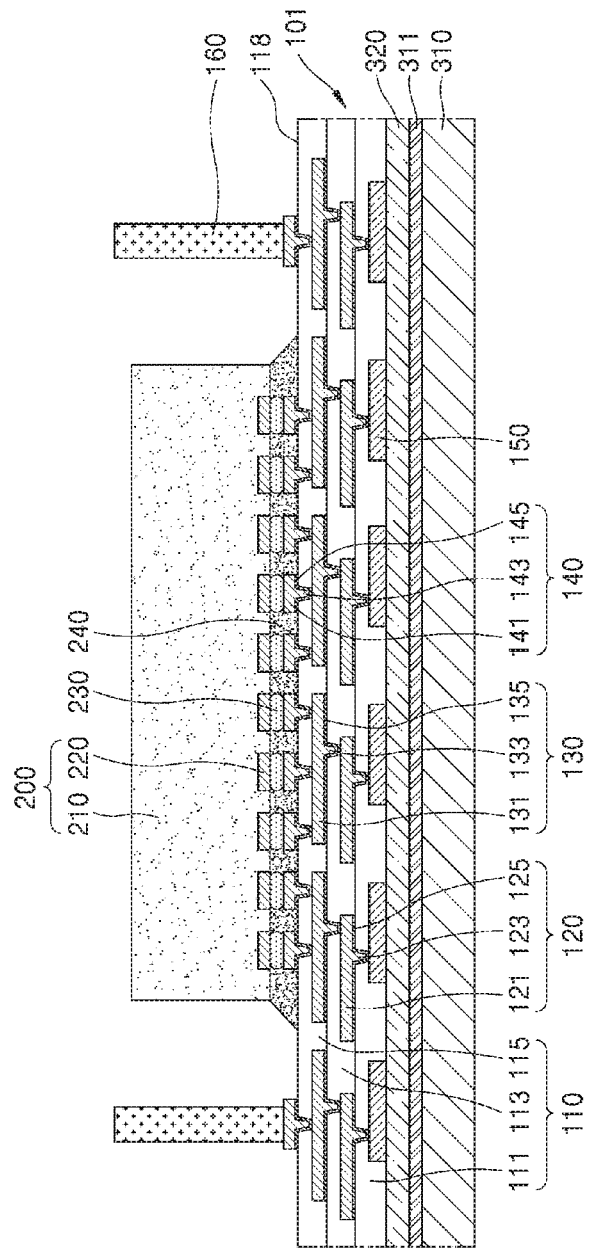

Referring to FIG. 9I, the semiconductor chip 200 is attached to the redistribution structure 101. The semiconductor chip 200 may be attached to the redistribution structure 101 such that the chip pad 220 faces the redistribution structure 101. The chip pad 220 of the semiconductor chip 200 may be connected to the third conductive line pattern 141 of the third redistribution pattern 140 through the chip connector 230.

After the semiconductor chip 200 is attached to the redistribution structure 101, the underfill material layer 240 is formed to fill the space between the semiconductor chip 200 and the redistribution structure 101. The underfill material layer 240 may surround the chip connector 230. For example, the underfill material layer 240 may be formed using a capillary underfill process after the semiconductor chip 200 is attached to the redistribution structure 101. In example embodiments, the underfill material layer 240 may be formed by attaching a non-conductive film to the chip pad 220 of the semiconductor chip 200 and attaching the semiconductor chip 200 to the redistribution structure 101.

Figure 9J:
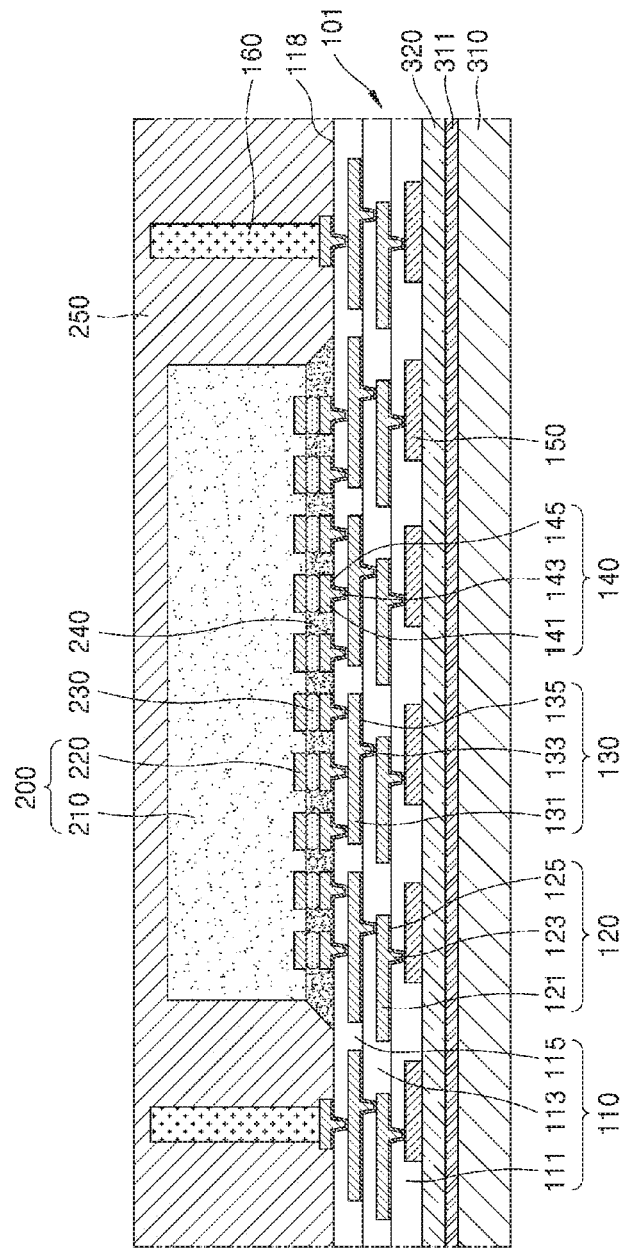

Referring to FIG. 9J, after the underfill material layer 240 is formed, the molding layer 250 is formed to mold the semiconductor chip 200. The molding layer 250 may cover the semiconductor chip 200 and the conductive post 160. The molding layer 250 may cover the side and top surfaces of the semiconductor chip 200 and the side and top surfaces of the conductive post 160.

Figure 9K:
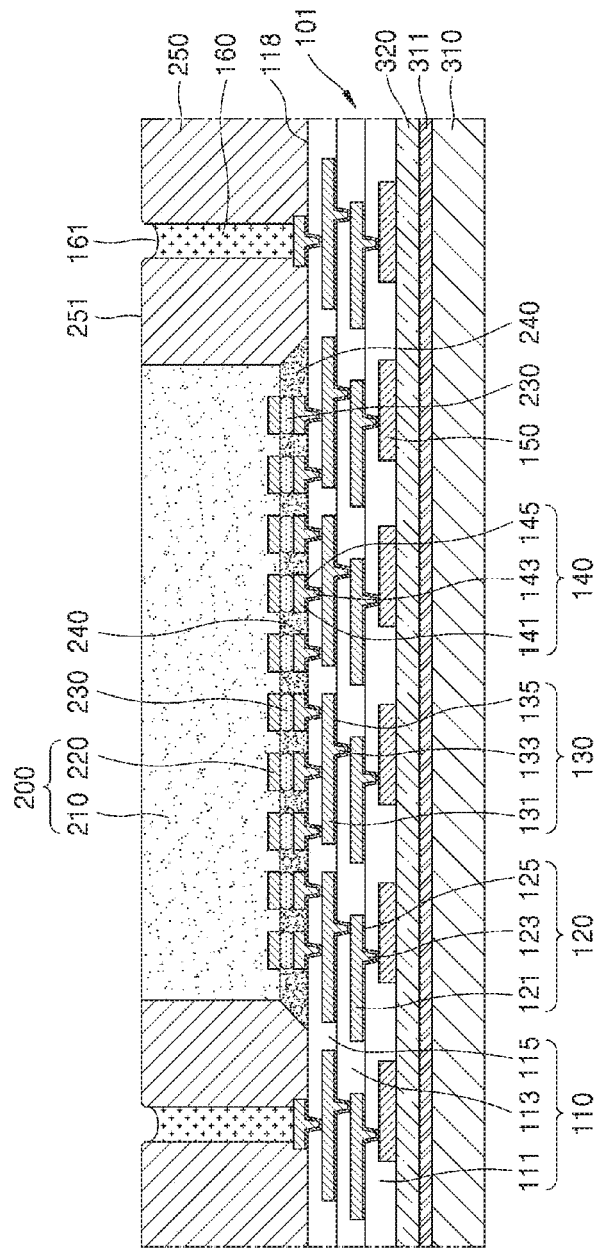

Referring to FIGS. 9K and 9J, a portion of the molding layer 250 may be removed so as to expose the conductive post 160. For example, etch-back or chemical mechanical polishing (CMP) may be performed to remove the portion of the molding layer 250. At this time, the top surface of the conductive post 160 may be formed to be at a lower level than the top surface of the molding layer 250 and to have a concave shape overall.

In example embodiments, dishing may be induced in the conductive post 160 by performing CMP on the molding layer 250 and the conductive post 160. The molding layer 250 and the conductive post 160 include different materials and thus have different removal rates during CMP. At this time, to control the amount of dishing of the conductive post 160, a material of the molding layer 250 and a material of the conductive post 160 may be appropriately selected. In example embodiments, the molding layer 250 may include an EMC and the conductive post 160 may include Cu. In addition, CMP conditions, e.g., pressure and rotating speed of a polishing head and the kind of slurry, may be controlled to control the amount of dishing of the conductive post 160.

In addition, a corner portion in which the top surface 251 of the molding layer 250 meets the inner wall 253 is ground away during the CMP, and accordingly, the corner portion 255 (see FIG. 2) of the molding layer 250 has a chamfer or round shape.

Figure 9L:
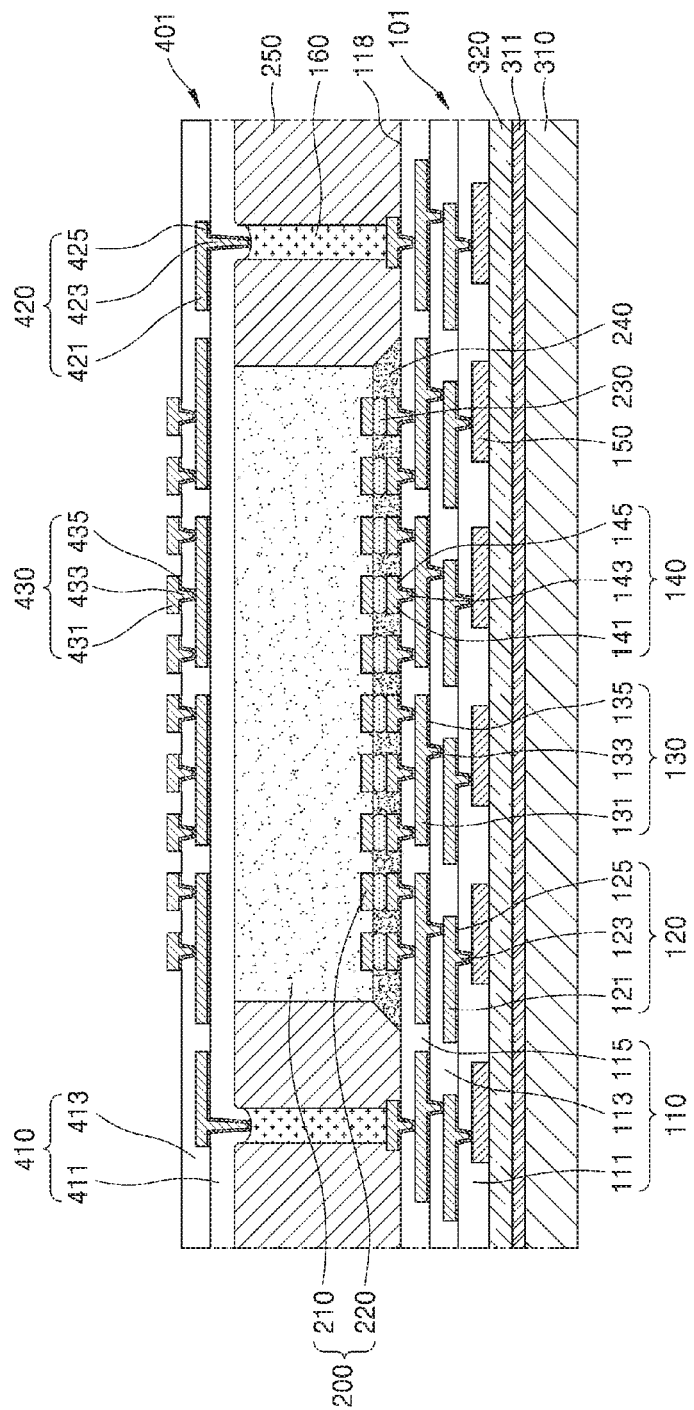

Referring to FIG. 9L, the first upper insulating layer 411 is formed on the semiconductor chip 200 and the molding layer 250. To form the first upper insulating layer 411, an insulating material film may be formed to cover the top surface of the molding layer 250 and the top surface of the semiconductor chip 200 and to fill the recess 257 (see FIG. 2) of the molding layer 250 and then partially removed by performing exposure and development such that a via opening exposing a portion of the top surface of the conductive post 160 may be formed.

To form the via opening of the first upper insulating layer 411, for example, RIE or laser drilling may be performed. The via opening of the first upper insulating layer 411 may have a shape, of which the horizontal width decreases toward the top surface of the conductive post 160.

After the first upper insulating layer 411 is formed, the first upper redistribution pattern 420 is formed. In detail, a seed metal film is formed on the top surface of the first upper insulating layer 411, an inner wall of the first upper insulating layer 411 provided by the via opening of the first upper insulating layer 411, and the portion of the top surface of the conductive post 160 exposed through the via opening of the first upper insulating layer 411. For example, the seed metal film may be formed using physical vapor deposition. After the seed metal film is formed, the first upper conductive line pattern 421 and the first upper conductive via pattern 423 are formed by forming a photoresist pattern including an opening and performing a plating process using the seed metal film as a seed. Thereafter, the photoresist pattern is removed, and a portion of the seed metal film, which is exposed by removing the photoresist pattern, is removed. As a result of removing the seed metal film, the first upper seed layer 425 may be formed between the top surface of the first upper insulating layer 411 and the first upper conductive line pattern 421, between the first upper conductive via pattern 423 and the inner wall of the first upper insulating layer 411, and between the first upper conductive via pattern 423 and the conductive post 160.

After the first upper redistribution pattern 420 is formed, the second upper insulating layer 413 may be formed using a procedure which is substantially the same as or similar to a procedure for forming the first upper insulating layer 411 and the second upper redistribution pattern 430 may be formed using a procedure which is substantially the same as or similar to a procedure for forming the first upper redistribution pattern 420. The first upper insulating layer 411, the first upper redistribution pattern 420, the second upper insulating layer 413, and the second upper redistribution pattern 430 may form the upper redistribution structure 401.

Figure 9M:
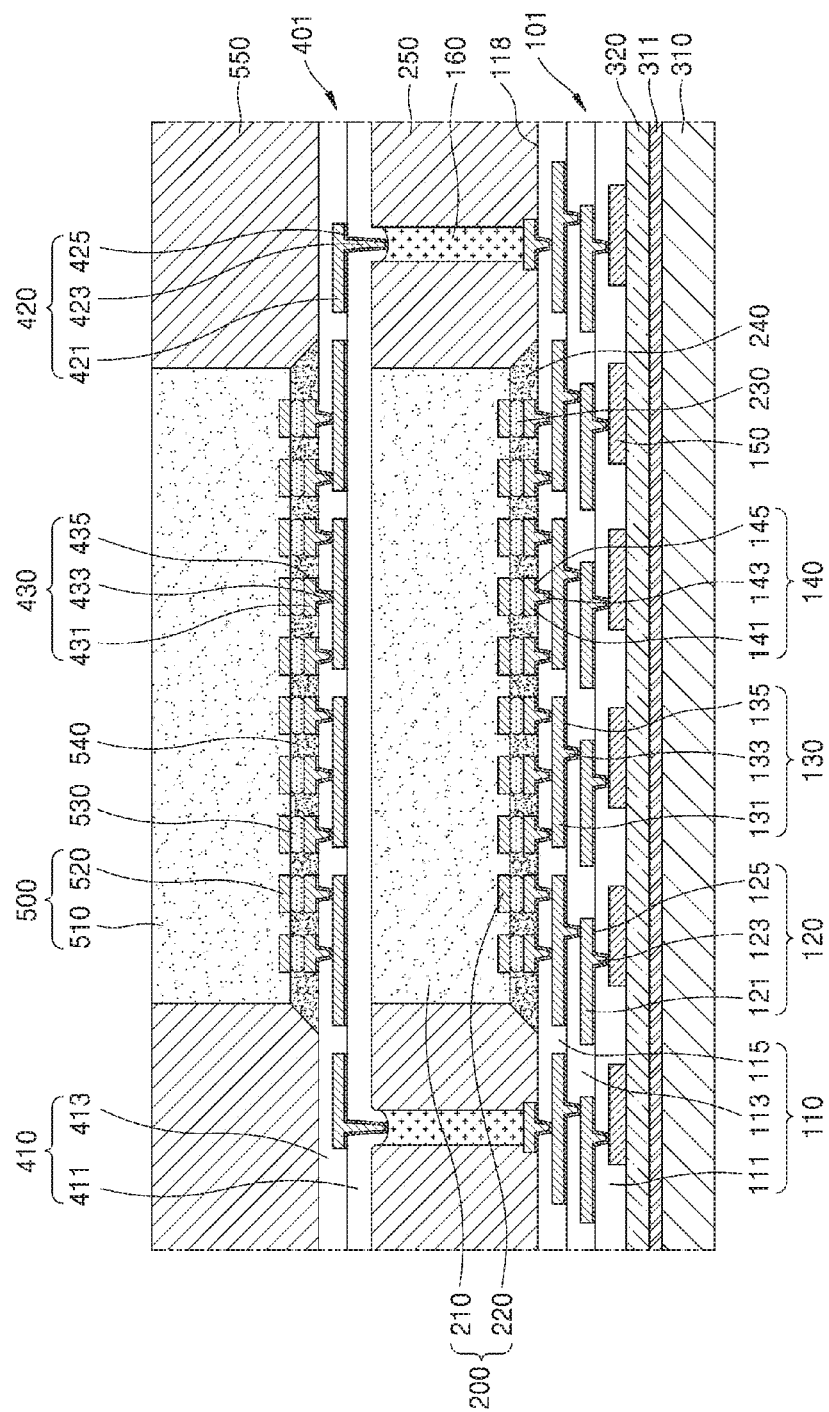

Referring to FIG. 9M, the upper semiconductor chip 500 is attached to the upper redistribution structure 401. The upper semiconductor chip 500 may be attached to the upper redistribution structure 401 such that the chip pad 520 faces the upper redistribution structure 401. The chip pad 520 of the upper semiconductor chip 500 may be connected to the second upper conductive line pattern 431 of the second upper redistribution pattern 430 through the chip connector 530.

After the upper semiconductor chip 500 is attached to the upper redistribution structure 401, the underfill material layer 540 is formed to fill the space between the upper semiconductor chip 500 and the upper redistribution structure 401 and to surround the chip connector 530.

After the underfill material layer 540 is formed, the upper molding layer 550 is formed to mold the upper semiconductor chip 500. The upper molding layer 550 may cover the side surface of the upper semiconductor chip 500.

Figure 9N:
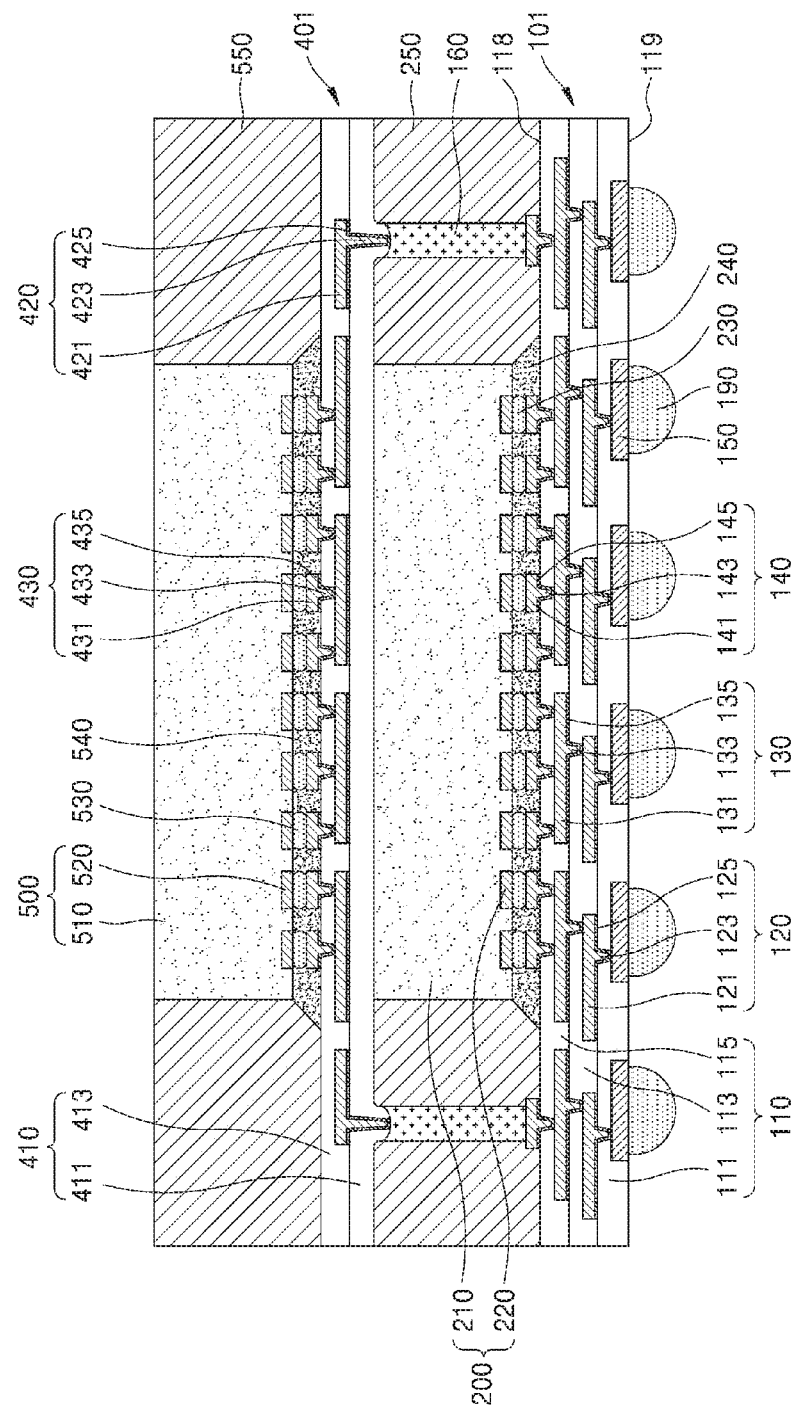
Figure 90:
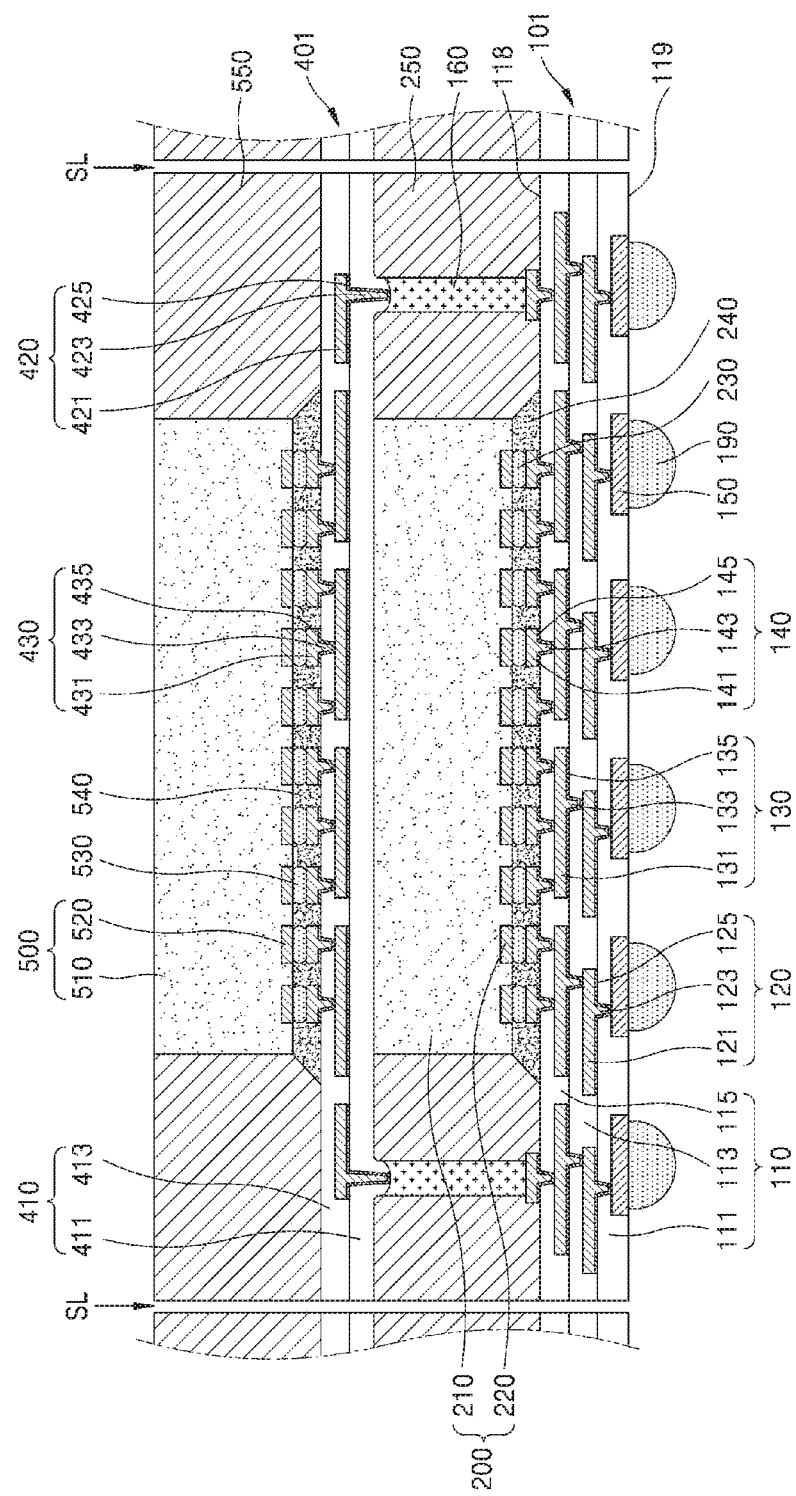

Referring to FIGS. 9N and 9M, after the upper molding layer 550 is formed, the carrier substrate 310 is removed. For example, the carrier substrate 310, to which the release film 311 is attached, is separated from a resultant structure of FIG. 9N. For example, to separate the carrier substrate 310, a laser beam or heat may be radiated to the release film 311.

After the carrier substrate 310 is separated, the cover layer 320 is removed such that the external electrode pad 150 is exposed. For example, the cover layer 320 may be removed using an etching process.

After the cover layer 320 is removed, the external connector 190 may be attached. The external connector 190 may include, for example, a solder ball or a bump.

Referring to FIG. 9O, after the external connector 190 is formed, the semiconductor package 10b of FIG. 4 may be completely formed by performing a singulation process in which a resultant structure of FIG. 9N is cut along a scribe lane SL.

According to embodiments, since the top surface of the conductive post 160 is at a lower level than the top surface of the molding layer 250, the conductive post 160 may be used as an align key, and accordingly, the accuracy of align key recognition may be increased when the first upper redistribution pattern 420 (in FIG. 9L) is formed. Since the accuracy of align key recognition is increased when the first upper redistribution pattern 420 is formed using the conductive post 160 as an align key, the electric characteristics of a semiconductor package are inhibited/prevented from being degraded by misalignment, and ultimately the reliability of the semiconductor package may be enhanced.

According to some embodiments, since the molding layer 250 has the corner portion 255 (in FIG. 5) that is chamfered or rounded, occurrence of a crack near the corner portion 255 of the molding layer 250 due to the concentration of stress on the corner portion 255 may be inhibited/prevented.

Figure 10:
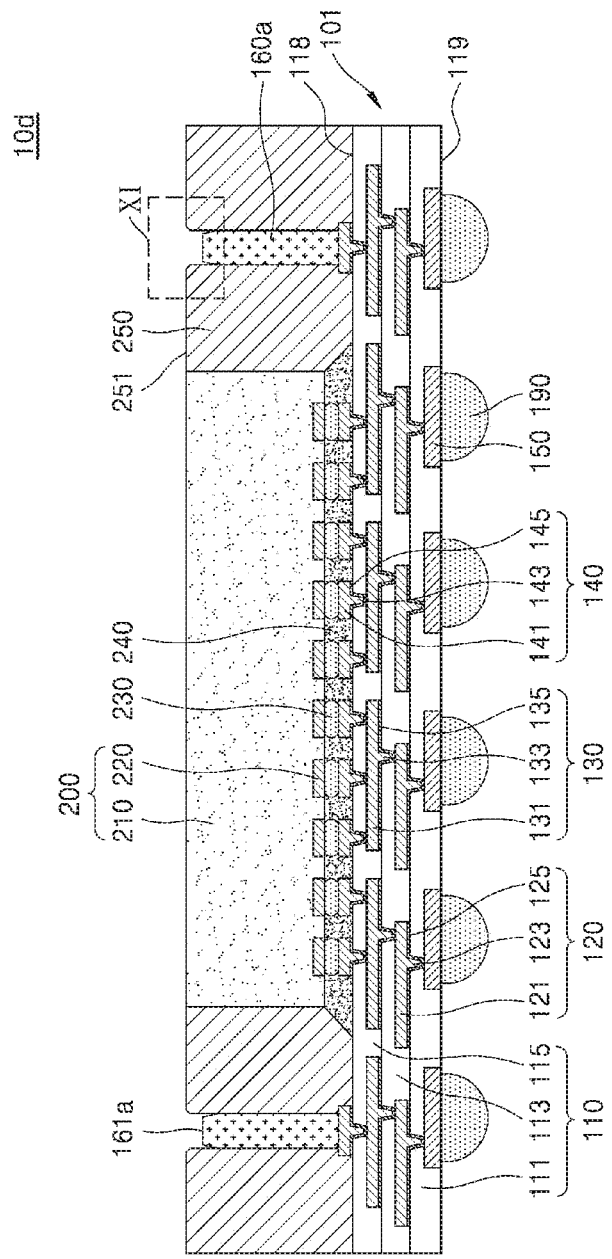
FIG. 10 is a cross-sectional view of a semiconductor package according to example embodiments.
Figure 11:
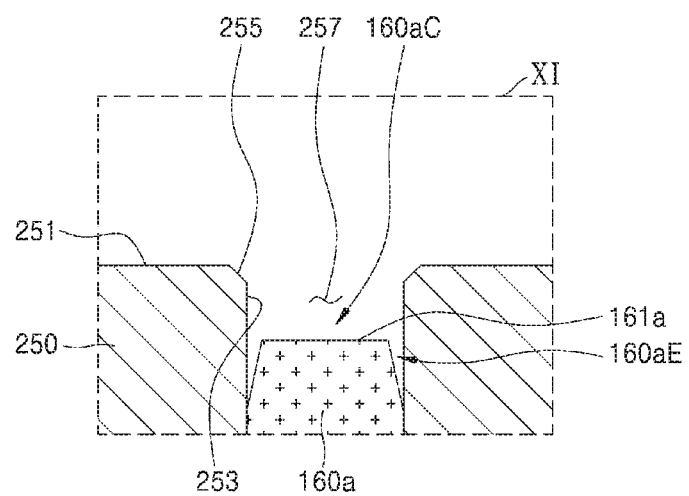
FIG. 11 is an enlarged cross-sectional view of a region XI in FIG. 10.

FIG. 10 is a cross-sectional view of a semiconductor package 10d according to example embodiments. FIG. 11 is an enlarged cross-sectional view of a region XI in FIG. 10.

The semiconductor package 10d illustrated in FIGS. 10 and 11 may be substantially the same as or similar to the semiconductor package 10 described with reference to FIGS. 1 and 2, except for the structure of a conductive post 160a. For convenience of description, the description will be focused on differences between the semiconductor package 10d and the semiconductor package 10 described with reference to FIGS. 1 and 2.

Referring to FIGS. 10 and 11, the semiconductor package 10d may include the redistribution structure 101, the semiconductor chip 200, the conductive post 160a, and the molding layer 250. A top surface 161a of the conductive post 160a may have substantially a convex shape. For example, a central portion 160aC of the top surface 161a of the conductive post 160a may be at a higher level than an edge portion 160aE of the top surface 161a of the conductive post 160a. The edge portion 160aE of the top surface 161a of the conductive post 160a may have a slope declining outward from the central portion 160aC of the top surface 161a of the conductive post 160a.

For example, the conductive post 160a may be formed by performing wet etch on a resultant structure of FIG. 9K. In detail, when CMP is performed to expose the conductive post 160 as described above with reference to FIG. 9K, a gap may be formed between the conductive post 160 and the molding layer 250 that have different properties. When a wet etch is performed on the resultant structure of FIG. 9K, etchant may flow into the gap between the conductive post 160 and the molding layer 250. The edge portion of the conductive post 160 is etched by the etchant flowing into the gap between the conductive post 160 and the molding layer 250 so that the conductive post 160a may have substantially the convex shape as shown in FIGS. 10 and 11.

While the inventive concepts have been particularly shown and described with reference to embodiments thereof, it will be understood that various changes in form and details may be made therein without departing from the scope of the following claims.

What is claimed is:

1. A semiconductor package comprising:
a semiconductor chip including a chip pad, the chip pad disposed on a lower surface of the semiconductor chip;
a lower redistribution structure on the lower surface of the semiconductor chip, the lower redistribution structure including a lower redistribution insulating layer and a lower redistribution pattern electrically connected to the chip pad of the semiconductor chip;
a molding layer on at least a portion of the semiconductor chip and on an upper surface of the lower redistribution structure; and
a conductive post in the molding layer, the conductive post having a bottom surface and a top surface, the bottom surface of the conductive post being in contact with the lower redistribution pattern of the lower redistribution structure and the top surface of the conductive post having a concave shape,
wherein the top surface of the conductive post is at a lower level than a top surface of the molding layer,
wherein the conductive post is on an inner wall of the molding layer, a first portion of the inner wall of the molding layer contacting a sidewall of the conductive post and a second portion of the inner wall of the molding layer being exposed and extending vertically above the top surface of the conductive post, wherein the first and second portions of the inner wall of the molding layer are vertically coplanar with each other and with the sidewall of the conductive post, and
wherein a corner portion of the molding layer slopes downward from the top surface of the molding layer to the second portion of the inner wall of the molding layer.

2. The semiconductor package of claim 1,
wherein a lowermost level of the corner portion of the molding layer is above an uppermost level of the top surface of the conductive post.

3. The semiconductor package of claim 1, further comprising:
an upper redistribution insulating layer including a first upper insulating layer and a second upper insulating layer that are sequentially stacked on the molding layer and the semiconductor chip; and
an upper redistribution pattern including an upper conductive line pattern and an upper conductive via pattern, the upper conductive line pattern being on a top surface of the first upper insulating layer and the upper conductive via pattern being electrically connected to the upper conductive line pattern.

4. The semiconductor package of claim 3,
wherein the upper redistribution pattern further includes a plurality of upper conductive via patterns connected to the upper conductive line pattern, and
wherein each of the plurality of upper conductive via patterns is in contact with the top surface of the conductive post.

5. The semiconductor package of claim 3,
wherein the corner portion of the molding layer is between the top surface of the molding layer and the inner wall of the molding layer and is chamfered or rounded, and
wherein the first upper insulating layer is on the inner wall of the molding layer and the corner portion of the molding layer.

6. The semiconductor package of claim 1, further comprising:
a connector on the top surface of the conductive post and on a first portion of the inner wall of the molding layer that is between the top surface of the molding layer and the top surface of the conductive post.

7. The semiconductor package of claim 6,
wherein the conductive post is on a second portion of the inner wall of the molding layer,
wherein the corner portion of the molding layer is between the top surface of the molding layer and the inner wall of the molding layer and is chamfered or rounded, and
wherein the connector is on the corner portion of the molding layer.

8. The semiconductor package of claim 1,
wherein the top surface of the conductive post is lower than a top surface of the semiconductor chip, and
wherein the top surface of the molding layer is coplanar with the top surface of the semiconductor chip.

9. The semiconductor package of claim 1, wherein the molding layer includes an epoxy molding compound, and the conductive post includes copper.

10. A semiconductor package, comprising:
a lower redistribution structure including a lower redistribution insulating layer and a lower redistribution pattern;
a semiconductor chip on an upper surface of the lower redistribution insulating layer, the semiconductor chip including a chip pad, the chip pad disposed on a lower surface of the semiconductor chip, the chip pad being electrically connected to the lower redistribution pattern;
a molding layer on a side surface of the semiconductor chip and on the upper surface of the lower redistribution structure; and
a conductive post in the molding layer, the conductive post having a bottom surface and a top surface, the bottom surface of the conductive post being in contact with the lower redistribution pattern of the lower redistribution structure and the top surface of the conductive post being at a lower level than a top surface of the molding layer,
wherein the conductive post is on an inner wall of the molding layer, a first portion of the inner wall of the molding layer contacting a sidewall of the conductive post and a second portion of the inner wall of the molding layer being exposed and extending vertically above the top surface of the conductive post, wherein the first and second portions of the inner wall of the molding layer are vertically coplanar with each other and with the sidewall of the conductive post, and
wherein a corner portion of the molding layer is between the top surface of the molding layer and the second portion of the inner wall of the molding layer and is chamfered or rounded.

11. The semiconductor package of claim 10, further comprising:
an upper redistribution insulating layer on the top surface of the molding layer and the top surface of the conductive post,
wherein the upper redistribution insulating layer is on the inner wall of the molding layer and the corner portion of the molding layer.

12. The semiconductor package of claim 10, further comprising:
a connector on the top surface of the conductive post,
wherein the connector is on the inner wall of the molding layer and the corner portion of the molding layer.

13. The semiconductor package of claim 10,
wherein the inner wall of the molding layer comprises a first inner wall that is opposite a second inner wall of the molding layer, and
wherein the conductive post extends continuously from the first inner wall of the molding layer to the second inner wall of the molding layer.

14. The semiconductor package of claim 10, wherein a central portion of the top surface of the conductive post is at a higher level than an edge portion of the top surface of the conductive post.

15. A semiconductor package comprising:
a lower redistribution structure including a lower redistribution insulating layer and a lower redistribution pattern;
a lower semiconductor chip on an upper surface of the lower redistribution insulating layer, the lower semiconductor chip including a chip pad, the chip pad disposed on a lower surface of the lower semiconductor chip, the chip pad of the lower semiconductor chip being electrically connected to the lower redistribution pattern;
a conductive post on the upper surface of the lower redistribution insulating layer, the conductive post being electrically connected to the lower redistribution pattern and having a top surface having a concave shape;
a molding layer on a side surface of the lower semiconductor chip and a side surface of the conductive post, the molding layer disposed on the upper surface of the lower redistribution structure, the molding layer having a top surface at a higher level than the top surface of the conductive post; and
an upper redistribution structure on the molding layer and the lower semiconductor chip, the upper redistribution structure including an upper redistribution insulating layer and an upper redistribution pattern, the upper redistribution insulating layer being on the top surface of the conductive post, and the upper redistribution pattern extending into a portion of the upper redistribution insulating layer and contacting the conductive post,
wherein at least a portion of the upper redistribution pattern is vertically overlapped with a top surface of the lower semiconductor chip,
wherein the conductive post is between the upper redistribution structure and the lower redistribution structure,
wherein the conductive post is on an inner wall of the molding layer, a first portion of the inner wall of the molding layer contacting a sidewall of the conductive post and a second portion of the inner wall of the molding layer being exposed and extending vertically above the top surface of the conductive post, wherein the first and second portions of the inner wall of the molding layer are vertically coplanar with each other and with the sidewall of the conductive post, and
wherein a corner portion of the molding layer is between the top surface of the molding layer and the second portion of the inner wall of the molding layer and is chamfered or rounded.

16. The semiconductor package of claim 15,
wherein a bottom surface of the molding layer contacts the upper surface of the lower redistribution insulating layer, and
wherein the upper redistribution insulating layer is on the inner wall of the molding layer and the corner portion of the molding layer.

17. The semiconductor package of claim 15, further comprising:

an upper semiconductor chip on the upper redistribution structure, the upper semiconductor chip being electrically connected to the conductive post through the upper redistribution pattern.

18. The semiconductor package of claim 15, wherein the upper redistribution pattern includes a plurality of upper conductive via patterns, and each of the plurality of upper conductive via patterns extends into the upper redistribution insulating layer and is electrically connected to the top surface of the conductive post.

19. The semiconductor package of claim 18, wherein the upper redistribution pattern further includes an upper seed layer, the upper seed layer including a first portion on side walls of the plurality of upper conductive via patterns and a second portion between the plurality of upper conductive via patterns and the top surface of the conductive post.

20. The semiconductor package of claim 15, wherein the top surface of the conductive post is lower than a top surface of the lower semiconductor chip.

\* \* \* \* \*